(12) United States Patent
Ballandras et al.

(10) Patent No.: US 12,255,612 B2
(45) Date of Patent: *Mar. 18, 2025

(54) SURFACE ACOUSTIC WAVE DEVICE ON COMPOSITE SUBSTRATE

(71) Applicant: Soitec, Bernin (FR)

(72) Inventors: Sylvain Ballandras, Besançon (FR); Thierry LaRoche, Besançon (FR)

(73) Assignee: Soitec, Bernin (FR)

( * ) Notice: Subject to any disclaimer, the term of this patent is extended or adjusted under 35 U.S.C. 154(b) by 0 days.

This patent is subject to a terminal disclaimer.

(21) Appl. No.: 18/583,235

(22) Filed: Feb. 21, 2024

(65) Prior Publication Data
US 2024/0250659 A1 Jul. 25, 2024

Related U.S. Application Data

(63) Continuation of application No. 17/043,559, filed as application No. PCT/EP2019/056436 on Mar. 14, 2019, now Pat. No. 11,936,364.

(30) Foreign Application Priority Data

Mar. 29, 2018 (FR) ...................................... 1852750

(51) Int. Cl.
*H03H 9/02* (2006.01)
*H03H 3/08* (2006.01)
(Continued)

(52) U.S. Cl.
CPC .......... *H03H 9/02866* (2013.01); *H03H 3/08* (2013.01); *H03H 9/02574* (2013.01);
(Continued)

(58) Field of Classification Search
CPC .. H03H 9/02866; H03H 3/08; H03H 9/02574; H03H 9/02661; H03H 9/145;
(Continued)

(56) References Cited

U.S. PATENT DOCUMENTS 6,445,265 B1    9/2002 Wright
11,936,364 B2 *   3/2024 Ballandras ............... H03H 3/08
(Continued)

OTHER PUBLICATIONS

Chung et al., Proton-Exchanged 36° Y-X LiTaO3 Waveguides for Surface Acoustic Wave, IEEE Transactions on Ultrasonics, Ferroelectronics, and Frequency Control, vol. 53, No. 2, (Feb. 2006), pp. 502-505.

(Continued)

*Primary Examiner* — Jorge L Salazar, Jr.
(74) *Attorney, Agent, or Firm* — TraskBritt

(57) ABSTRACT

A surface acoustic wave device comprising a base substrate, a piezoelectric layer and an electrode layer in between the piezoelectric layer and the base substrate, a comb electrode formed on the piezoelectric layer comprising a plurality of electrode means with a pitch p, defined asp=A, with A being the wavelength of the standing acoustic wave generated by applying opposite potentials to the electrode layer and comb electrode, wherein the piezoelectric layer comprises at least one region located in between the electrode means, in which at least one physical parameter is different compared to the region underneath the electrode means or fingers. A method of fabrication for such surface acoustic wave device is also disclosed. The physical parameter may be thickness, elasticity, doping concentration of Ti or number of protons obtained by proton exchange.

15 Claims, 16 Drawing Sheets

(51) Int. Cl.
*H03H 9/145* (2006.01)
*H03H 9/25* (2006.01)
*H03H 9/64* (2006.01)

(52) U.S. Cl.
CPC ........ *H03H 9/02661* (2013.01); *H03H 9/145* (2013.01); *H03H 9/25* (2013.01); *H03H 9/6489* (2013.01)

(58) Field of Classification Search
CPC .... H03H 9/25; H03H 9/6489; H03H 9/02622; H03H 9/02614; H03H 9/02228; H03H 9/02842
USPC .......................................... 333/133, 193–196
See application file for complete search history.

(56) References Cited

U.S. PATENT DOCUMENTS

| | | |
|---|---|---|
| 2009/0102316 A1 | 4/2009 | Belot et al. |
| 2013/0321100 A1 | 12/2013 | Wang |
| 2016/0182009 A1 | 6/2016 | Bhattacharjee |

OTHER PUBLICATIONS

European Communication pursuant to Article 94(3) EPC for European Application No. 19709524, dated Mar. 17, 2023, 6 pages.
International Search Report for International Application No. PCT/EP2019/056436 dated Jun. 17, 2019, 5 pages.
International Written Opinion for International Application No. PCT/EP2019/056436 dated Jun. 17, 2019, 7 pages.
Kone et al., Resonator Using Guided Waves in a Piezoelectric Layer above a Bragg Mirror, 2008 IEEE International Frequency Control Symposium, (May 19, 2008), pp. 581-585.
Yantchev et al., Micromachined Thin Film Plate Acoustic Resonators Utilizing the Lowest Order Symmetric Lamb Wave Mode, IEEE Transactions on Ultrasonics, Ferroelectrics, and Frequency Control, vol. 54, No. 1, (Jan. 1, 2007), pp. 87-95.
Yokoyama et al., Dopant Concentration Dependence of Electromechanical Coupling Coefficients of co-doped AlN Films for BAW Devises, IEEE International Ultrasonics Symposium, (Sep. 18, 2016), pp. 1-4.

\* cited by examiner

SURFACE ACOUSTIC WAVE DEVICE ON COMPOSITE SUBSTRATE

CROSS-REFERENCE TO RELATED APPLICATIONS

This application is a continuation of U.S. patent application Ser. No. 17/043,559, filed Sep. 29, 2020, now U.S. Pat. No. 11,936,364, issued Mar. 19, 2024, which is a national phase entry under 35 U.S.C. § 371 of International Patent Application PCT/EP2019/056436, filed Mar. 14, 2019, designating the United States of America and published in English as International Patent Publication WO 2019/185363 A1 on Oct. 3, 2019, which claims the benefit under Article 8 of the Patent Cooperation Treaty to French Patent Application Serial No. 1852750 filed Mar. 29, 2018, the disclosure of each of which is hereby incorporated herein in its entirety by this reference.

TECHNICAL FIELD

The present disclosure relates to a surface acoustic wave device and a method of fabrication of the surface acoustic wave device.

BACKGROUND

In recent years, surface acoustic wave (SAW) devices based on a composite substrate have shown improved temperature characteristics and performances as filter devices, especially for mobile phone applications.

In a typical surface acoustic wave (SAW) device, one or more inter-digitated transducers (IDTs) are used to convert acoustic waves to electrical signals and vice versa by exploiting the piezoelectric effect of certain materials. An inter-digitated transducer (IDT) comprises opposing "combs" with inter-digitated metal fingers disposed on a piezoelectric substrate. A surface acoustic wave can be established on the substrate by electrically exciting the fingers. Conversely, an electrical signal can be induced across the fingers by a surface acoustic wave propagating in the piezoelectric substrate material beneath the transducer.

However, such surface acoustic wave devices are in practice limited to operating frequencies from about 1 to 3 GHz, as the electrode pitch p of the comb electrodes determines the wavelength $\lambda$ of the acoustic wave given by the relation $\rho=/n$, with $n \geq 2$, generally equal to 2. Thus, it is in practice difficult to further miniaturize comb electrodes when higher operating frequencies are required, which is on the one hand due to lithography reasons, and on the other hand due to electric loss reasons.

In a second harmonic SAW device, or in film bulk acoustic wave resonators (FBAR), instead of an inter-digitated transducer structure with opposing combs at opposing potentials, a transducer structure with a non-structured electrode (FBAR) or only one comb electrode (second harmonic SAW) is used. Instead of using a second comb electrode, a counter electrode on the back of the piezoelectric structure is used. This counter electrode is typically at mass and the comb electrode at a given potential. The acoustic waves are then excited by making the single comb transducer work on its second Bragg harmonic, as shown in U.S. Pat. No. 6,445,265 B1. The coherence of phase being obtained when the period of the comb p is equal to the acoustic wavelength $\lambda$, this approach makes it possible to double the frequencies of operation of the components compared to traditional inter-digitated transducers of the same geometries (same period, same number of fingers, etc.) while maintaining robustness in terms of manufacturing.

However, in such a second harmonic SAW device, due to the second harmonic mode being excited, the generated acoustic wave is a standing wave. The realization of a SAW filter device based on such transducer structure may rely, for instance, on the possibility to couple evanescent waves in the longitudinal direction. Thus, the electromechanical coupling obtained for such a device is not efficient. An alternative approach for building filters using such principle consists in using the SAW device as impedance element of a so-called ladder filter. In that case, the SAW device is used as a resonator that can be combined with other resonators according to the state-of-the-art to provide a filtering function.

However, energy losses are still present for such transducer structure due to non-guided acoustic energy corresponding to volume modes excited by the transducer structure.

BRIEF SUMMARY

The object of the disclosure is, therefore, to overcome these drawbacks by providing a second harmonic surface acoustic wave device deposited on a composite substrate with a new design.

The object of the disclosure is achieved by a surface acoustic wave device comprising a base substrate, a piezoelectric layer and an electrode layer between the piezoelectric layer and the base substrate, further comprising a comb electrode formed on the piezoelectric layer comprising a plurality of electrode means with a pitch $\rho$, defined as $\rho=\lambda$, with $\lambda$ being the wavelength of the standing acoustic wave generated by applying opposite potentials to the electrode layer and comb electrode, characterized in that the piezoelectric layer comprises at least one region located in between the electrode means in which at least one physical parameter is different compared to the region underneath the electrode means.

In the prior art, second harmonic SAW devices, besides the standing waves excited in the thickness direction of the piezoelectric layer, laterally propagating acoustic waves can also be excited. These laterally propagating acoustic waves are a result of the coupling between the standing acoustic waves and the bulk acoustic waves generated. By having at least one region of the piezoelectric layer located in between the electrode means in which at least one physical parameter is different compared to the region underneath the electrode means, it is possible to modify the coupling between these two types of acoustic waves leading to a reduction or even suppression of this unwanted effect. In particular, it becomes possible to guide the acoustic waves within the piezoelectric layer.

According to an embodiment of the disclosure, the at least one physical parameter of the piezoelectric layer being different in the at least one region is the elasticity of the piezoelectric layer. By having at least one region located in between the electrode means in which at least one physical parameter of the piezoelectric layer is different compared to the region underneath the electrode means, it is, therefore, possible to modify the coupling of the bulk acoustic waves and the standing acoustic waves, and obtain the propagation of evanescent acoustic waves in the longitudinal direction.

According to one embodiment of the disclosure, the at least one physical parameter of the piezoelectric layer being different in the at least one region is a dopant concentration, in particular, the dopant concentration of Ti in the piezoelectric layer. It is, therefore, possible to modify the coupling of the bulk acoustic waves and the standing acoustic waves, and obtain the propagation of evanescent acoustic waves in the longitudinal direction.

According to one embodiment of the disclosure, the thickness t, in the at least one region of the piezoelectric layer is smaller than the thickness t of the piezoelectric layer. According to another variant, the piezoelectric layer can be present only underneath the electrode means towards the base substrate. By having a thinner piezoelectric layer in between the electrode means or by even completely removing it, the coupling of the bulk acoustic waves and the standing acoustic waves is modified. It becomes even possible to obtain evanescent acoustic waves in the longitudinal direction, thereby reducing unwanted spurious effects.

According to an embodiment of the disclosure, the surface acoustic wave device as described above can further comprise a Bragg mirror underneath the piezoelectric layer. A Bragg mirror reduces energy loss towards the base substrate, and can add mechanical stability to the device structure.

According to another embodiment of the disclosure, the electrode layer in between the piezoelectric layer and the base substrate can be part of the Bragg mirror, in particular, the top layer of the Bragg mirror. By using the top layer as electrode layer, the number of fabrication steps of the device can be reduced.

According to one embodiment of the disclosure, the Bragg mirror can comprise a plurality of layers of alternating impedance. In such mirror, the stack parameters such as the thickness of the layers and the impedance ratio of the layers, corresponding to the difference in impedance between the high and low impedance layers, enables to control and/or adjust and/or improve the reflectivity of the mirror and the frequency bandpass.

According to one embodiment of the disclosure, the thickness of the piezoelectric layer can be chosen to optimize the coupling between the bulk acoustic wave and the standing acoustic wave generated between the comb electrode and the electrode layer, being in the sub wavelength range, in particular, on the order of $\lambda/2$, more in particular, on the order of $\lambda/4$ or less. It is, therefore, possible to obtain guided acoustic waves within the piezoelectric layer, as the thickness of the piezoelectric layer is in the order or smaller than the wavelength of the transducer structure, in particular, on the order of $\lambda/2$, more in particular, on the order of $\lambda/4$ or less.

According to an embodiment of the disclosure, the dimension of the comb electrode is defined by the optimization of the coupling between the bulk acoustic wave and the standing acoustic wave generated between the comb electrode and the electrode layer. A coupling between the bulk acoustic wave and the standing acoustic wave results in a propagation of guided waves within the piezoelectric layer, in the longitudinal direction. Therefore, by modifying the structural features of the comb electrode, it is possible to improve this coupling and thus to increase the propagation of guided waves within the piezoelectric layer.

The object of the present disclosure is also achieved, by a method comprising the steps of a) providing an electrode layer on top of a base substrate, b) providing a piezoelectric layer on the electrode layer and c) forming an upper comb electrode layer on the piezoelectric layer, wherein the step b) of providing the piezoelectric layer comprises providing at least one region located in between the electrode means in which at least one physical parameter is different compared to the region underneath the electrode means.

According to one embodiment of the disclosure, the step b) can comprise an etching step, in order to remove part or the entire piezoelectric layer in the region of the piezoelectric layer located between the electrode means. This simplifies the fabrication process.

According to an embodiment of the disclosure, the step b) comprises an implantation or diffusion of atomic species, in particular, Ti, in the region of the piezoelectric layer located between the electrode means. According to another variant, the step b) comprises a proton exchange in the region of the piezoelectric layer situated in between the electrode means. This enables the use of the standard processing technique well suited for piezoelectric layer in order to have different physical parameter of the piezoelectric layer within a region of the piezoelectric layer.

According to one embodiment of the disclosure, the method of fabrication of a surface acoustic wave device as described above further comprises a step d) of providing a Bragg mirror on or over the base substrate, before the step of providing the piezoelectric layer. This allows a thin-film formation process such as vapor deposition or sputtering to be used to form a thin piezoelectric layer in the sub-wavelength range with ease and accuracy.

According to an embodiment of the disclosure, the Bragg mirror is provided such that the electrode layer is part of the Bragg mirror. This allows to further simplify the fabrication process by reducing the amount of layers to be deposited, without having to compromise on the performance of the mirror and thus of the device.

According to an embodiment of the disclosure, at least one of the steps a) to d) of the method of fabrication of a surface acoustic wave device as described above is a layer transfer process. It is, for example, possible to use a SMART CUT® process, in which a transfer of a layer of a donor substrate onto a support substrate is carried out by propagation of a fracture wave along an interface in the donor substrate weakened previously by ion implantation, during thermal annealing.

The object of the present disclosure is also achieved by a frequency filter device comprising a surface acoustic wave device according to any of the variants of the disclosure.

BRIEF DESCRIPTION OF THE DRAWINGS

The present disclosure may be understood by reference to the following description taken in conjunction with the accompanying figures, in which reference numerals identify features of embodiments of the Present disclosure.

DETAILED DESCRIPTION

Figure 1A:
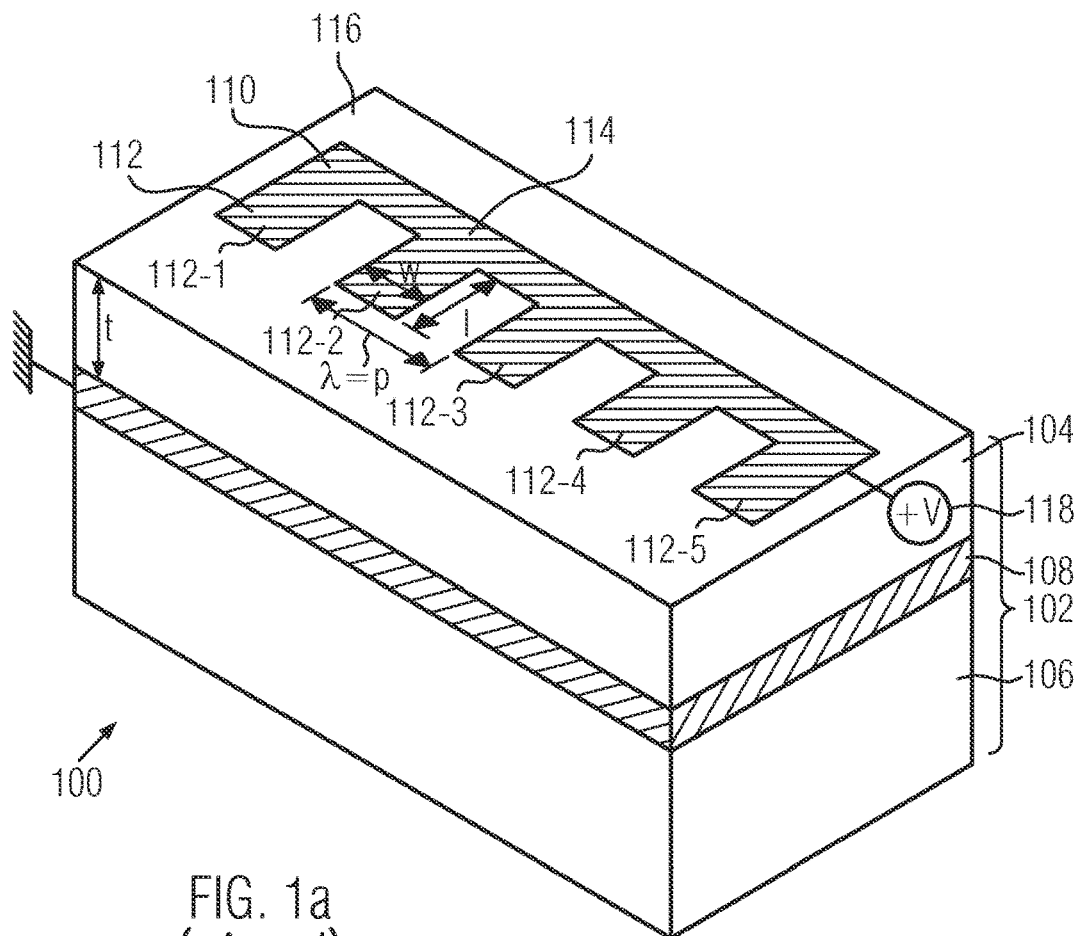
FIGS. 1a and 1b show a surface acoustic wave device known as a second harmonic surface acoustic wave device according to the state of the art.

FIG. 1a shows a surface acoustic wave device 100 according to the state of the art. It comprises an acoustic wave propagating substrate 102, comprising a piezoelectric layer 104 of a thickness t and a base substrate 106. The surface acoustic wave device 100 also comprises an electrode layer 108, formed above the base substrate 106 and below the piezoelectric layer 104. The electrode layer 108 may be connected to ground. The electrode layer 108 is formed of any suitable conductive metal, for example, aluminum, or aluminum alloy or tungsten.

The surface acoustic wave device 100 further comprises a comb electrode 110, having a plurality of electrode fingers 112 extending from a respective conducting portion 114. The comb electrode 110 and its respective conducting portion 114 are formed of any suitable conductive metal, for example, aluminum, or aluminum alloy or tungsten.

A transducer structure 116 is, therefore, present in the surface acoustic wave device 100 comprising the comb electrode 110 with the plurality of electrode fingers 112 on top the piezoelectric layer 104 and the bottom electrode layer 108 below the piezoelectric layer 104.

Figure 1B:
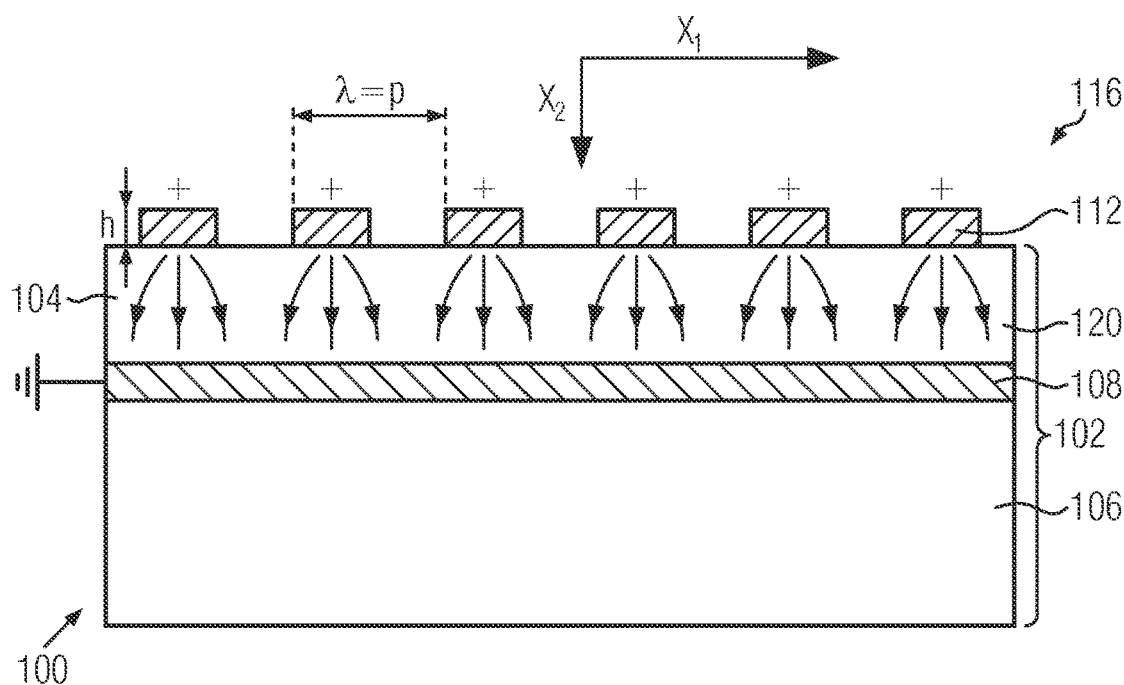

Notably, transducers generally have a much larger number of electrode fingers than depicted in FIGS. 1a and 1b. The number of actual electrode fingers has been significantly reduced in the drawing figures in an effort to more clearly depict the overall concept.

The electrode fingers 112 of the comb electrode 110 typically all have essentially the same length l, width w as well as thickness h (shown in FIG. 1b). In one embodiment, the electrode fingers 112 can also be tapered.

The electrode fingers 112 of the comb electrode 110 are all connected to a potential 118 being here +V, and the transducer structure 116 is thus defined by its electrode pitch $\rho$, corresponding to the edge-to-edge electrode finger distance between two neighboring electrode fingers, e.g., 112_2 and 112_3 as illustrated in FIG. 1a. As all the electrode fingers 112 are connected to the same potential +V, the electrode pitch $\rho$ of the transducer structure 116 is given by $\rho=\lambda$, corresponding to twice the Bragg condition, or also called the second harmonic mode. For an inter-digitated transducer structure, corresponding usually to the state of the art for transducer structure used in SAW devices, the Bragg condition is given by $\rho=2\lambda$.

FIG. 1b shows the same surface acoustic wave device 100 as in FIG. 1a, in a side view, showing the electrode fingers 112 of the comb electrode 110. The substrate 102 on which the transducer structure 116 is realized is the same as mentioned previously for FIG. 1a. All features with the same reference numeral as in FIG. 1a are not described again in detail, but reference is made to their description above.

In the geometry as illustrated in FIGS. 1a and 1b, having all the electrode fingers 112 at the same potential, it is not possible to create an electric field in the direction $X_1$ perpendicular to the longitudinal extension l of the electrode fingers 112 and, therefore, it is not possible to couple acoustic modes from the transducer structure 116 along the usual IDT operating mode.

By placing the electrode layer 108 at ground underneath the piezoelectric layer 104, an electrical field 120 is created between the electrode fingers 112 and the electrode layer 108, in the direction $X_2$, necessary to the electromechanical or piezoelectric coupling of the bulk acoustic modes, as achieved for second harmonic SAW devices, for instance. The transducer structure 116 thus allows an excitation of acoustic waves in the electrical field direction, meaning in the direction $X_2$ in FIG. 1b. The excitation of acoustic waves is in majority taking place in the bulk of the piezoelectric layer 104 (direction $X_2$), and in the form of standing acoustic waves. The plurality of single resonators corresponding to the electrode fingers of the top comb electrode generate a synchronism effect, which yields the guided wave to take place in the piezoelectric layer 104 at a frequency given by the piezoelectric layer thickness and the comb electrode period $\rho$ together.

The transducer structure 116 presents energy loss due to non-guided acoustic energy corresponding to volume modes excited by the transducer structure 116, which escape into the base substrate 106. When used in a SAW device, this effect leads to poor performances of the SAW device.

The presence of the electrode layer 108 below the piezoelectric layer 104 reduces part of this energy loss in the base substrate 106 as the thin electrode layer 108 acts as a conductive shield between the piezoelectric layer 104 and the base substrate 106 in such a way that the electrical field lines 120 of the piezoelectric layer 104 are confined.

FIGS. 2a to 2e illustrate a surface acoustic wave device 200 according to a first embodiment of the Present disclosure. The surface acoustic wave device 200 is realized on a substrate 202, comprising a piezoelectric layer 204 and a base substrate 206.

The base substrate 206 used in the first embodiment of the disclosure is a substrate of silicon, in particular, a substrate of silicon comprising a so-called trap-rich layer at the interface with the electrode layer 208. Instead of silicon, other substrate materials with high acoustic wave propagation velocity can be chosen, such as diamond, sapphire, silicon carbide or even aluminum nitride.

The surface acoustic wave device 200 also comprises an electrode layer 208, formed over the base substrate 206 and below the piezoelectric layer 204. The electrode layer 208 is connected to ground. The electrode layer 208 can also be connected to a potential +V or −V. The electrode layer 208 is formed of any suitable conductive metal, for example, aluminum, aluminum alloy, molybdenum or tungsten.

Figure 2A:
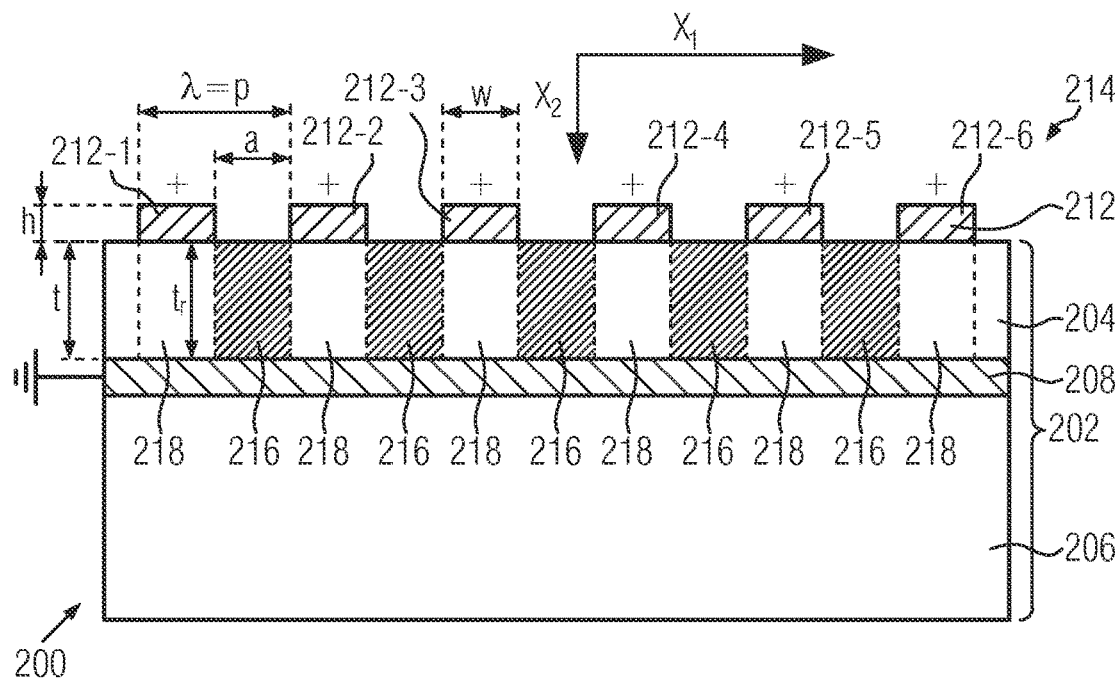
FIGS. 2a to 2e show a surface acoustic wave device according to a first embodiment of the disclosure.
Figure 2B:
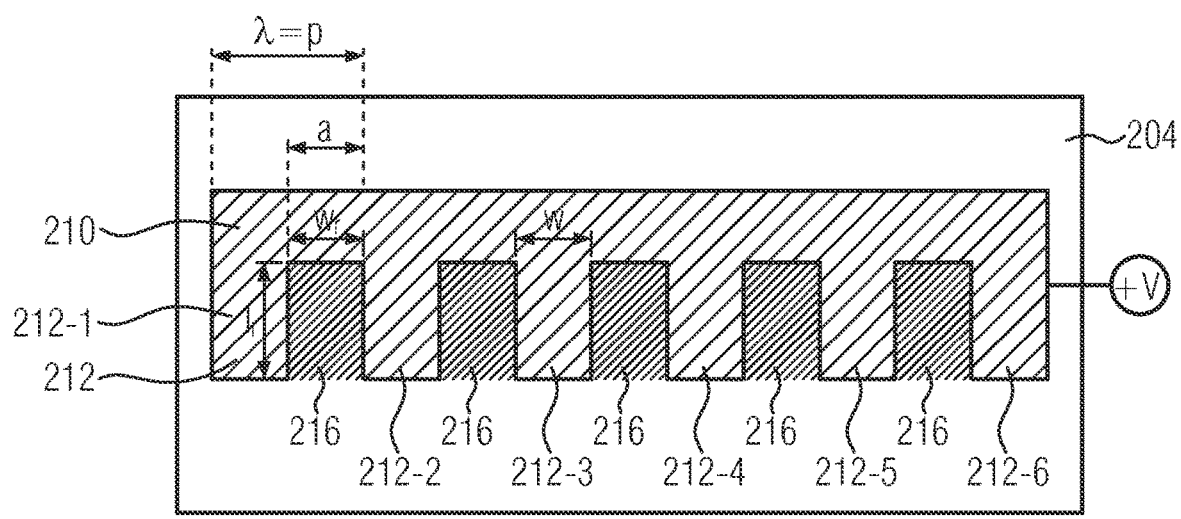

The surface acoustic wave device 200 comprises also a comb electrode 210 as shown in FIG. 2b, having a plurality of electrode means 212 (sometimes referred to as "electrode fingers 212"). The comb electrode 210 and its respective electrode means 212 are formed of any suitable conductive metal, for example, aluminum or aluminum alloy, molybdenum or tungsten. In this embodiment, the electrode means 212 have the shape of electrode fingers.

The electrode fingers 212 of the comb electrode 210 all have essentially the same length l, width w as well as thickness h. According to a variant of the embodiment, the electrode fingers 212 can have different length l, width w and thickness h.

The electrode fingers 212 of the comb electrode 210 are all connected to the same potential +V. The electrode fingers 212 of the comb electrode 210 can also be connected to −V, or to mass (not shown).

A transducer structure 214 is, therefore, present in the surface acoustic wave device 200 comprising the comb electrode 210 with the plurality of electrode fingers 212 on top the piezoelectric layer 204 and the bottom electrode layer 208 below the piezoelectric layer 204. In a variant, the comb electrode 210 with the plurality of electrode fingers 212 is buried in the piezoelectric layer 204.

The piezoelectric layer 204 in this embodiment is lithium niobate ($LiNbO_3$) or lithium tantalate ($LiTaO_3$) or any other suitable material. The thickness t of the piezoelectric layer 204 formed over the base substrate 206 is on the order or smaller than the wavelength of the transducer structure 214, in particular, on the order of $\lambda/2$, more in particular, on the order of $\lambda/4$ or less. The wavelength is the wavelength of the surface acoustic wave generated in the piezoelectric layer 204.

In a variant of the disclosure, the piezoelectric layer 204 can also be a polycrystalline material or an epitaxy material, as well as Zinc Oxide (ZnO) or aluminum nitride (AlN) or aluminum scandium nitride (AlScN) or Gallium Nitride (GaN).

The transducer structure 214 is defined by its electrode pitch p, corresponding to the edge-to-edge electrode finger distance between two neighboring electrode fingers, e.g., 212_1 and 212_2, as shown in FIGS. 2a and 2b. As all the electrode fingers 212 are connected to the same potential +V, the pitch p of the transducer structure 214 is given by $p=\lambda$, corresponding to twice the Bragg condition, or also called the second harmonic mode. These second harmonic modes are excited within the piezoelectric layer 204 when the electrode 208 is connected to ground, and the electrode fingers 212 of the comb electrode 210 to a uniform potential +V.

Furthermore, the piezoelectric layer 204 comprises regions 216 that are located within the piezoelectric layer 204 and in between adjacent electrode fingers 212, for example, between electrode fingers 212_1 and 212_2 when seen from the side as illustrated in FIG. 2a and from the top as illustrated in FIG. 2b.

As seen in FIGS. 2a and 2b, the dimensions of the regions 216 are given by the distance a between two adjacent electrode fingers 212 as width $w_r$, the thickness t of the piezoelectric layer 204 as height $t_r$ and the length l of the electrode fingers 212 as length $l_r$.

According to the disclosure, at least one of the regions 216 has at least one physical parameter that is different compared to the rest of the piezoelectric layer 204, in particular, with respect to the areas 218 underneath the electrode fingers 212. The physical parameter can be the elasticity, a dopant concentration, the thickness, etc.

In a variant, the physical parameter in the regions 216 being different compared to the rest of the piezoelectric layer 204 varies amongst the regions 216. For example, a region 216 can have a different elasticity compared to the rest of the piezoelectric layer 204, while another region 216 has a different dopant concentration compared to the rest of the piezoelectric layer 204.

In a variant, the length $l_r$ of the regions 216 can be shorter or larger than the length l of the electrode fingers 212.

Figure 2C:
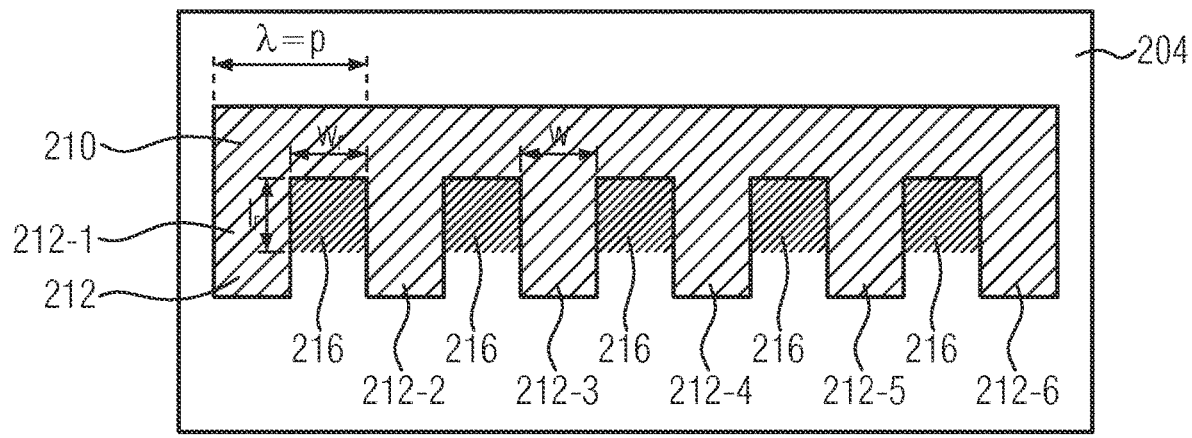

FIG. 2c illustrates the variant where the length $l_r$ of the regions 216 is shorter than the length l of the electrode fingers 212.

In a variant, the width $w_r$ of the regions 216 can be smaller or bigger than the distance a between two adjacent electrode fingers 212.

Figure 2D:
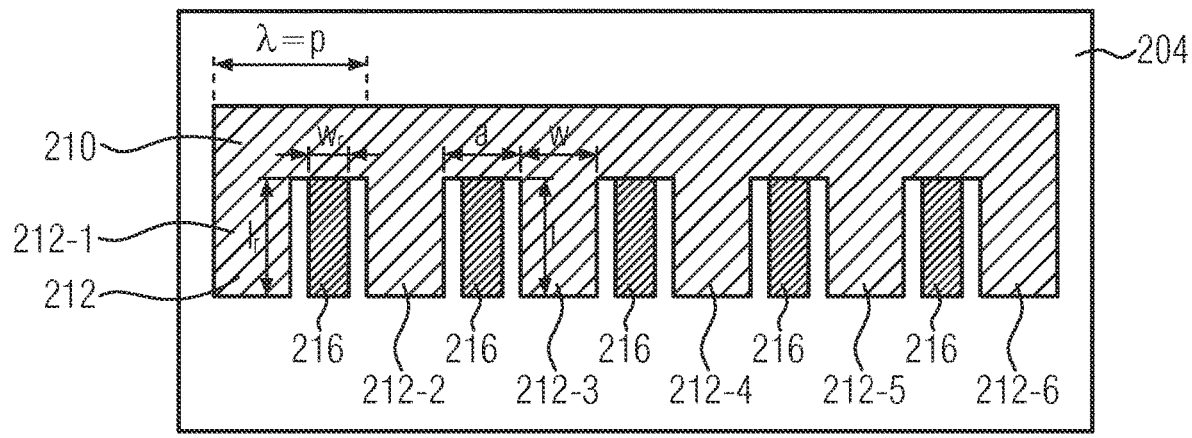

FIG. 2d illustrates the variant where the width $w_r$ of the regions 216 is smaller than the distance a between two adjacent electrode fingers 212, for example, between 212_1 and 212_2.

In another variant, the regions 216 do not have the same characteristics with respect to each other.

Figure 2E:
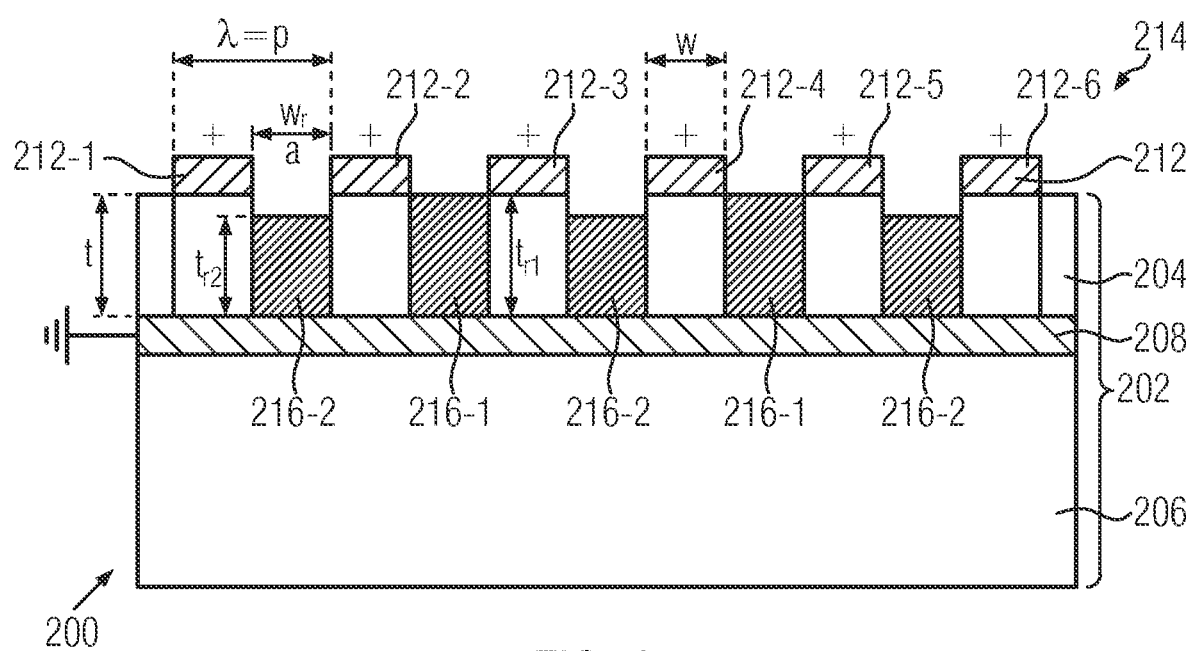

In FIG. 2e, the piezoelectric layer 204 can comprise first regions 216_1 with thickness $t_{r1}$ being the same or almost the same as the thickness t of the piezoelectric layer 204 and second regions 216_2 with thickness $t_{r2}$ being smaller than the thickness t of the piezoelectric layer 204. As an alternative or in addition, the width $w_r$ and/or length $l_r$ and/or any other physical parameter of the first and second regions 216_1 and 216_2 may be different. Furthermore, the first and second regions 216_1 and 2162 may form a periodic pattern or a non-periodic pattern.

In another variant, the regions 216 can have a geometrical form being of the type of a rectangle as shown in FIG. 2a, or a triangle or a diamond or any other form.

The physical parameters of the piezoelectric layer 204 can be modified by using an implantation of diffusion process of atomic or ionic species within the piezoelectric layer 204. A proton exchange process can also be used or any other process that enables to locally change the physical parameters in the at least one region 216 of the piezoelectric layer 204.

The SAW device 200 functions in the following way. The piezoelectric layer 204 produces vibrations in response to a voltage applied between the transducer electrode fingers 212 and the bottom electrode layer 208. The majority of the excitation of acoustic waves is taking place in the bulk of the piezoelectric layer 204 (in the $X_2$ direction), and here it is actually referred to standing acoustic waves. The electrode pitch p of the transducer structure 214 is defined as $\lambda$, $\lambda$ being the wavelength of the standing acoustic wave. This signifies that the transducer structure 214 is operating in a synchronous mode, in the bandpass of the electrode fingers 212, but corresponding to the second Bragg harmonic. The resonant frequency $f_r$ of the transducer structure 214 is higher by a factor 2 compared to the resonant frequency of an inter-digitated transducer structure.

The piezoelectric coupling between the longitudinal direction of propagation $X_1$ and the direction of propagation in the bulk $X_2$, as well as the periodicity of the electrode fingers of the transducer structure 214 give the possibility to have propagation of guided acoustic waves in the piezoelectric layer 204, namely, evanescent acoustic waves in the $X_1$ direction. The piezoelectric coupling actually refers to the piezoelectric coefficients coupling excitation in one direction and vibration in the orthogonal direction within the so-called sagittal plane, being the plane in which the wave polarization is defined. By varying the physical parameters of the piezoelectric layer 204 within the regions 216, it is, therefore, possible to vary and control the coupling between $X_1$ and $X_2$ within the transducer structure 214.

Figure 3A:
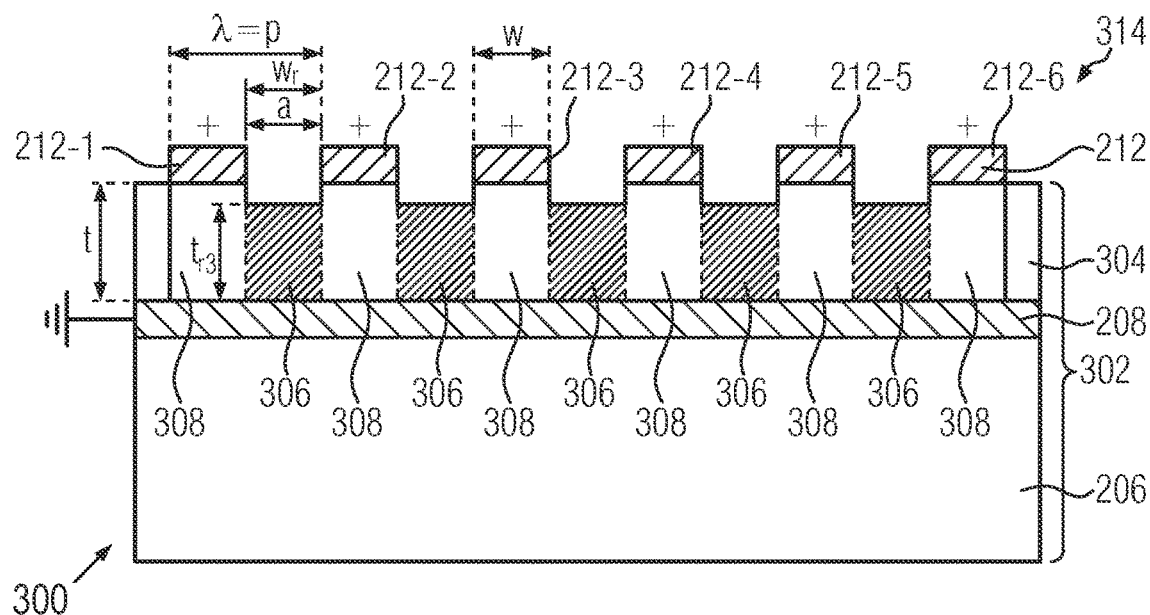
FIGS. 3a and 3b show a surface acoustic wave device according to a second embodiment of the disclosure.
Figure 3B:
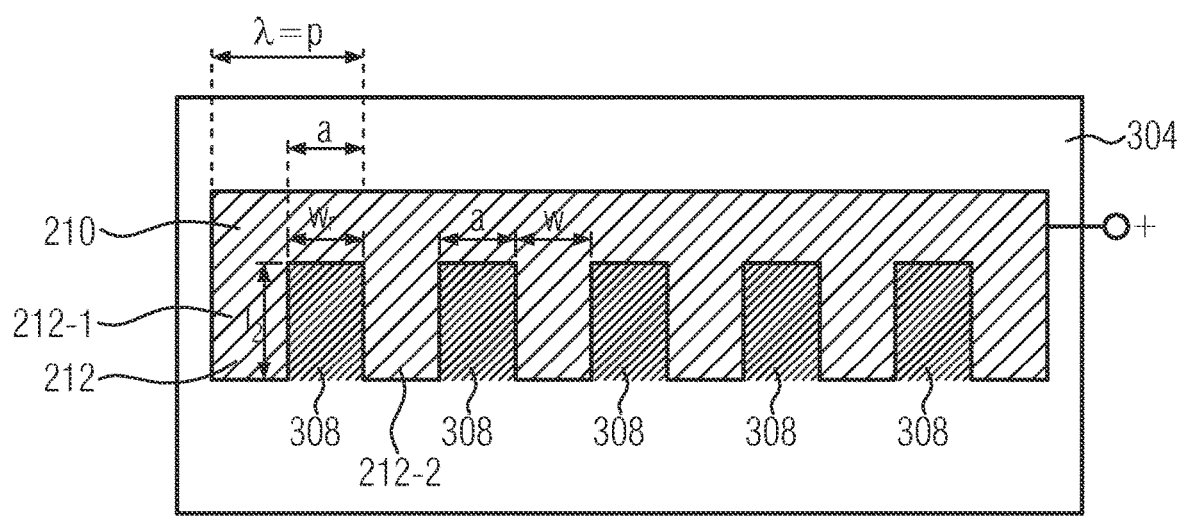

FIGS. 3a and 3b illustrate a surface acoustic wave device according to the second embodiment of the disclosure, in a side view (FIG. 3a) and a top view (FIG. 3b). The surface acoustic wave device 300 comprises a modified piezoelectric layer 304 in comparison with the surface acoustic wave device 200 of the first embodiment, which is the only difference with respect to the first embodiment. All other features are the same and not, therefore, be described in detail again but reference is made to their description above.

The surface acoustic wave device 300 comprises a piezoelectric layer 304, formed over the electrode layer 208 and the base substrate 206.

The piezoelectric layer 304 is of the same piezoelectric materials as the piezoelectric layer 204 of the first embodiment. It has a thickness t on the order or smaller than the wavelength λ of the transducer structure, in particular, on the order of λ/2, more in particular, on the order of λ/4 or less.

The piezoelectric material layer 304 can be attached to the electrode layer 208 and base substrate 206 by a layer transfer process or by direct bonding. In a variant, a thin $SiO_2$ layer (not shown) can be introduced between the electrode layer 208 and the base substrate 206 to improve the attachment.

Like the surface acoustic wave device 200 according to the first embodiment, the surface acoustic wave device 300 according to the second embodiment comprises a comb electrode 210, as illustrated in FIG. 3b, having a plurality of electrode fingers 212, connected to a potential, here a positive potential.

In this embodiment, the piezoelectric layer 304 comprises regions 306 where the thickness $t_r$ of the piezoelectric layer 304 is smaller compared to the thickness t of the rest of the piezoelectric layer 304, in particular, with respect to the areas 308 underneath the electrode means 212. The regions 306, like the regions 216 in the first embodiment, are positioned in between each two adjacent electrode fingers 212, for example, between electrode fingers 212_1 and 212_2. The regions 306 have a width $w_r$, a length $l_r$ and a thickness $t_r$. In FIG. 3b, the dimensions of the regions 306 are given by the distance a between two adjacent electrode fingers 212 as width $w_r$ and the length l of the electrode fingers 212 as length $l_r$.

As can be seen in FIG. 3a, the thickness $t_r$ of the regions 306 is smaller than the thickness t of the piezoelectric layer 304 in the areas 308.

Like in the first embodiment, the length $l_r$ of the regions 306 can be smaller or larger than the length l of the electrode fingers 212. In a variant, the width $w_r$ of the regions 306 can be smaller or larger than the distance a between adjacent electrode fingers 212. In another variant, the dimensions of the regions 306 can vary amongst each other. For example, the piezoelectric layer 304 can comprise regions 306 with different thicknesses $t_r$.

In a variant, the regions 306 can have a geometrical form being of the type of a rectangle as shown in FIGS. 3a and 3b, or a triangle or a diamond or any other form. The thickness $t_r$ of the regions 306 can also vary within its width $w_r$.

In the variant where all the electrode fingers 212 have varying dimensions of width and length, the regions 306 can also vary in dimensions, respectively, with the electrode fingers 212 dimensions.

In a variant of the embodiment, the piezoelectric layer 304 still present in the regions 306 can also have one or more of its other physical parameters modified and, therefore, be combined with the features according to the first embodiment and its variants.

The thickness $t_r$ of the piezoelectric layer 304 in the region 306 can be reduced compared to the thickness t of the piezoelectric layer 304, by using an etching process of the piezoelectric layer 304, for example, a selective chemical etching or any other process suitable to remove material from the piezoelectric layer 204.

Due to the presence of regions 306 within the piezoelectric layer 304, in which part of the piezoelectric layer 304 is removed, it is possible to change the coupling between $X_1$ and $X_2$ within the transducer structure 314.

By varying the thickness $t_r$ of the piezoelectric layer 304 within the regions 306, it is, therefore, possible to vary and control the coupling between $X_1$ and $X_2$ within the transducer structure 314.

Figure 4:
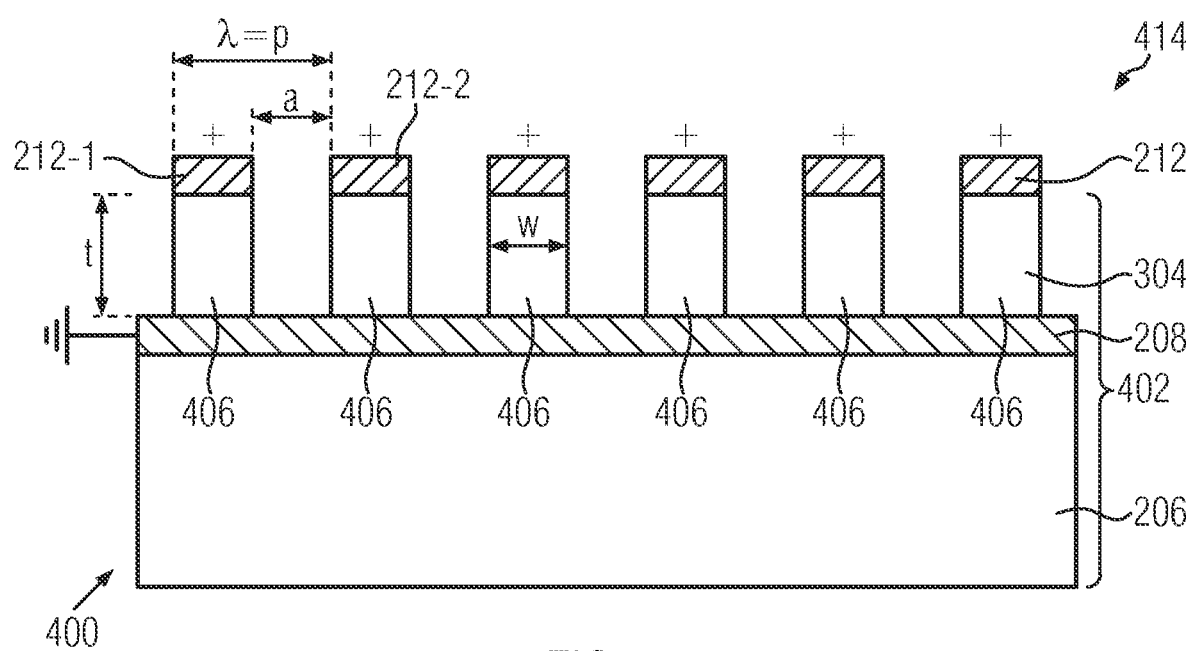
FIG. 4 shows a surface acoustic wave device according to a third embodiment of the disclosure.

FIG. 4 illustrates a third embodiment of the disclosure, where the piezoelectric layer 304 is or remains present only underneath the electrode fingers 212. In the regions between adjacent electrode fingers 212, for example, 212_1 and 212_2, the piezoelectric layer 304 has been fully removed.

In another variant, the piezoelectric layer 304 has been fully removed in between at least only some of the two adjacent electrode fingers 212 and, therefore, the piezoelectric layer 304 can still be present between other adjacent electrode fingers 212.

Like in the second embodiment, an etching process of the piezoelectric layer 404 is used to remove the piezoelectric layer 304 between the electrode fingers 212, for example, a selective chemical etching or any other process that enables to remove the piezoelectric layer 304. Furthermore, the composite substrate 402 of the surface acoustic wave device 400 is the same as the composite substrate 302 of the second embodiment, comprising a piezoelectric layer 304, formed over the electrode layer 208 and the base substrate 206.

According to further variants of the disclosure, a combination of embodiment one, two and three can be present in the piezoelectric layer. Thus, the piezoelectric layer in the composite substrate 402 for the surface acoustic wave device can comprise regions of modified physical parameters of the piezoelectric layer and/or regions where the thickness of the piezoelectric layer is reduced and/or regions where the piezoelectric layer is absent.

By removing the piezoelectric layer 304 in between the electrode fingers 212, the coupling between $X_1$ and $X_2$ within the transducer structure 314 can be changed and adapted.

Figure 5A:
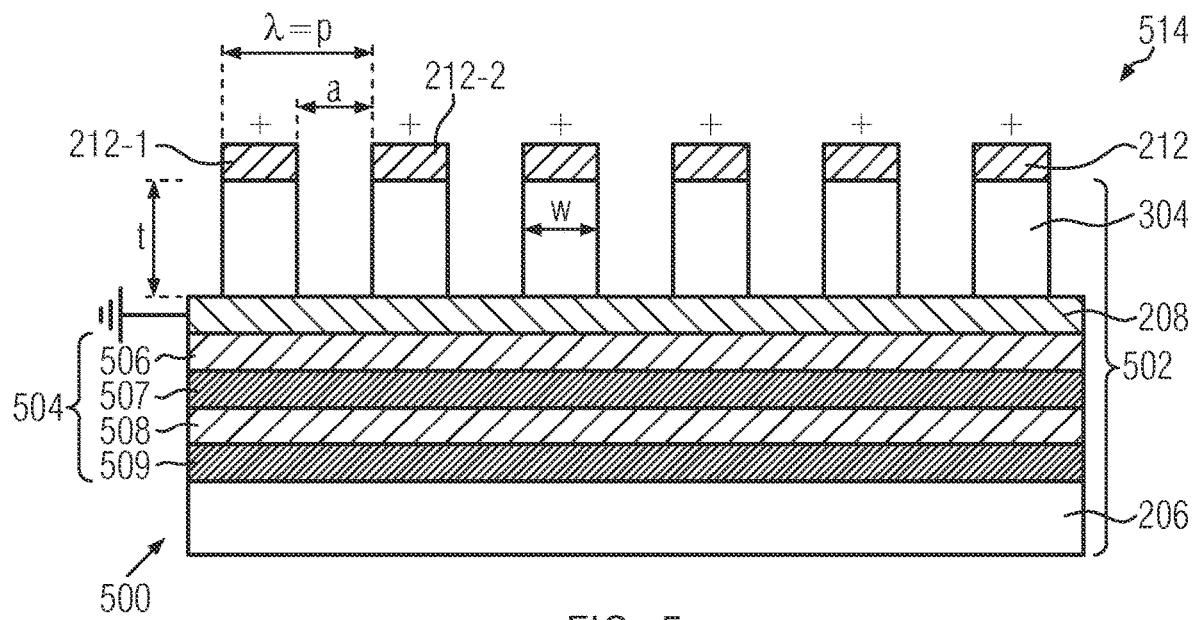
FIG. 5a shows a surface acoustic wave device according to a fourth embodiment of the disclosure.
Figure 5B:
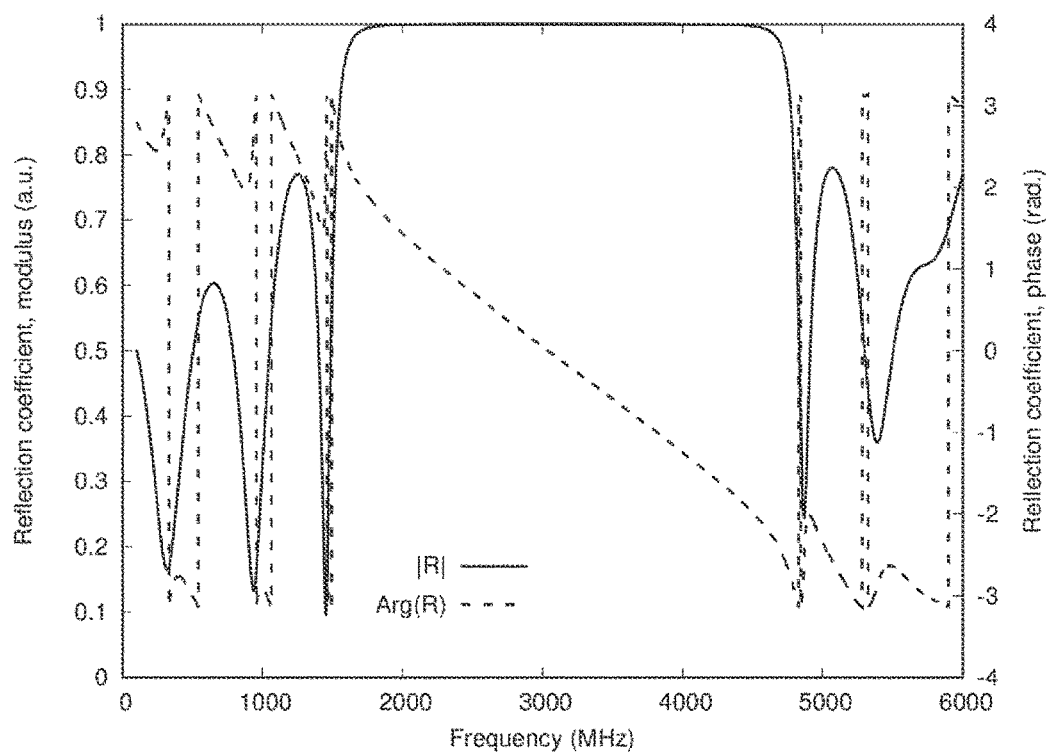
FIG. 5b shows the characteristics of a Bragg Mirror for a particular example of the fourth embodiment of the disclosure.

FIGS. 5a and 5b show a surface acoustic wave device according to a fourth embodiment of the disclosure. The surface acoustic wave device 500 comprises a different composite substrate 502 in comparison with the composite substrate 402 of the surface acoustic wave device 400 of the third embodiment, which is the only difference with respect to the third embodiment. All other features are the same and will not, therefore, be described in detail again but reference is made to their description above.

The surface acoustic wave device 500 comprises a composite substrate 502 comprising, like the composite substrate 402 and/or 302, a piezoelectric layer 304, formed over the electrode layer 208 and the base substrate 206, but furthermore comprising an acoustic mirror 504, formed above the base substrate 206 and below the piezoelectric layer 304.

The acoustic mirror 504 comprises a plurality of stacked layers 506 to 509, the layers with an even reference numeral 506, 508 being of a first material and the layers with an odd reference numeral 507, 509 being of a second material. The first and second materials have different acoustic impedances, so that the acoustic mirror 504 comprises a stacking of alternating high and low impedance layers. The acoustic mirror 504 is also called a Bragg mirror.

The Bragg mirror 504 has a periodical repetition of a pair of layers with a thickness of about a quarter of a wavelength with alternating high/low impedances, to ensure the reflection.

The first and second materials can be chosen amongst tungsten, molybdenum, $LiTaO_3$, $Al_2O_3$, AlN, $LiNbO_3$, $Si_3N_4$ and any combination of $SiO_2$ and $Si_3N_4$ (known as silicon oxy-nitride and noted $SiO_xN_y$, with x and y controlling the amount of each element in the compound) and ZnO, aluminum or $SiO_2$.

In a variant, the first material and the second material can be exchanged so that the first material has a low impedance and the second material has a high impedance.

In one practical example, a silicon base substrate 206 and an acoustic mirror 504 formed of an alternation of tungsten and aluminum layers may be used.

In this embodiment, the acoustic mirror 504 is represented as having four layers 506-509 forming the stack of alternating high and low impedance layers. But in another variant, the acoustic mirror 504 can also have more or less than four layers of alternating high and low impedance forming the stack.

Increasing the number of pairs in a Bragg mirror increases the mirror reflectivity and increasing the impedance ratio between the materials in the Bragg pairs increases both the reflectivity and the bandwidth. A common choice of materials for the stack is, for example, titanium dioxide and silica.

FIG. 5b actually illustrates the characteristics of a Bragg mirror for a practical example of the disclosure, showing the modulus and phase of the reflection effect of the Bragg mirror.

For this particular example, the composite substrate of the surface acoustic wave device comprises a C-axis oriented aluminum nitride layer of 1.5 µm thickness, and a bottom electrode of 100 nm thickness. The Bragg mirror comprises an alternation of molybdenum and silica or fused quartz, each 500 nm thick, deposited onto a sapphire substrate. The substrate could also be silicon.

The reflection function achieved by this mirror is computed using the Green's function of the whole stack. Only the longitudinal wave normal to the substrate was considered here, as no shear wave can be excited by the aluminum nitride layer. It turns out that the use of three and half period yields an effective reflection effect, as depicted in FIG. 5b. The reflection is almost total (|R|~1) from 2 to 4.3 GHz. Smaller stop band can also be achieved.

The thicknesses of the stack are chosen such as to promote a unique mode within the transducer structure 514 to ensure the spectral purity of the SAW devices 500 based on this kind of transducer structure 514.

In a variant of the embodiment, one of the stacked layers 506-509 of the acoustic mirror 504 forms the electrode layer 208. In particular, the top layer 506 of the acoustic mirror 504 forms the electrode layer 208. In this case, the top layer 506 of the acoustic mirror 504 is preferably comprised of a metal having a high acoustic impedance such as tungsten.

Like in the first embodiment, the piezoelectric layer 304 produces vibrations in response to a voltage being applied between the transducer electrode fingers 212 and the bottom electrode layer 208. The excitation of acoustic wave is in majority taking place in the bulk of the piezoelectric layer 304, and here it is actually referred to standing acoustic waves. Furthermore, the presence of the bulk acoustic waves also leads to parasitic modes being non-guided modes within the piezoelectric layer 304.

The combination of a piezoelectric layer 304 and an acoustic mirror 504 leads to a multi-mode nature, as additional default modes are added. A simple piezoelectric layer 304 may guide several modes, the so-called Lamb waves or shear plate modes, for example. All these modes may be coupled by the transducer structure 514 provided guiding conditions are met. According to the disclosure, the piezoelectric layer 304 and the acoustic mirror 504 are arranged to reduce the contributions of these additional modes to promote a unique mode within the transducer structure 514 to ensure the spectral purity of the SAW devices 500, the other modes being located at a frequency much higher than the useful mode, preventing spectral pollution.

Indeed, for a given BAW metal-piezoelectric-metal structure, according to the piezoelectric layer crystal orientation, not only pure compressional waves but also shear or quasi shear waves can be generated, which may be reflected as well by the mirror in the transducer region thus generating parasites. The purpose of an adapted mirror design would then consists in choosing the mirror parts to favor compressional wave reflection and to let other modes passing through the substrate. Placing an appropriate absorbing (organic-polymer-based) layer beneath the substrate will allow for absorbing these waves and, therefore, reduce significantly their contribution to the resonator response.

According to the disclosure, the piezoelectric layer 304 and the acoustic mirror 504 are arranged to reduce the contributions of the additional modes to promote a unique mode within the transducer structure to ensure the spectral purity of the SAW devices 500. To do so, the thickness t of the piezoelectric layer 304 is chosen such that the excited modes vibrate in the desired frequency band and be guided inside the piezoelectric layer 304, with no opportunity of escaping into the base substrate 206, due to the presence of the acoustic mirror 504.

The other approach is to optimize the thicknesses of the stack of the acoustic mirror 504 to promote the unique mode within the transducer structure, and to realize an efficient reflection coefficient for this mode. The acoustic mirror 504 thus acoustically isolates vibrations generated between the electrode fingers 212 and the electrode layer 208 from the base substrate 206.

According to a variant of the disclosure, the piezoelectric layer 304 can also be realized according to any realization and/or variants described above with respect to the first to third embodiment.

Figure 6A:
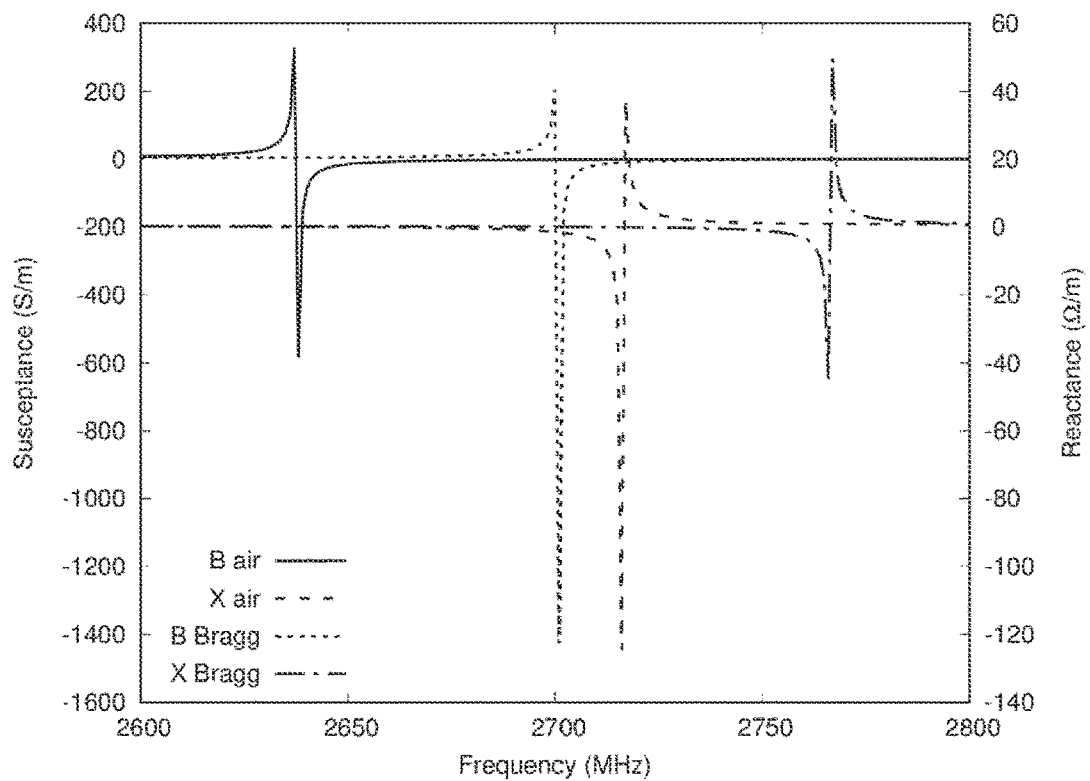
FIGS. 6a and 6b show the harmonic admittance and the mesh used to simulate the bulk resonance, respectively, of a bulk acoustic device for the particular example of the Bragg mirror of FIG. 5b.
Figure 6B:
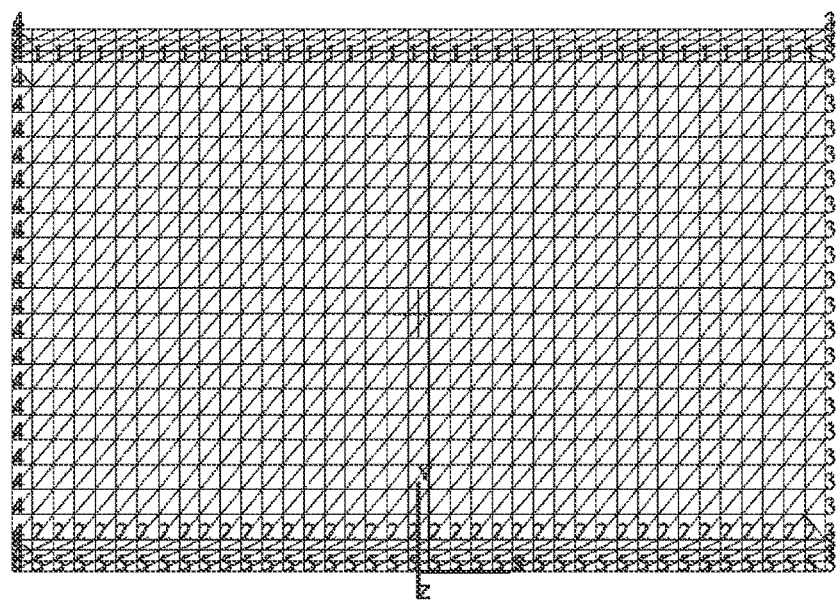

FIG. 6a shows the calculated harmonic admittance of a bulk acoustic device for the particular example of the Bragg mirror of FIG. 5b, calculated using the mesh structure shown in FIG. 6b.

For this particular example, a 1-D bulk acoustic wave resonator comprises a top electrode of 100 nm, an AlN layer of 1.5 µm and a bottom electrode of 100 nm. The Bragg mirror comprises an alternation of molybdenum and silica or fused quartz layers, each 500 nm thick.

FIG. 6b shows the mesh used to simulate the bulk resonance. The top electrode is referenced as 1 and the bottom electrode as 2, while the periodic boundary conditions are referenced as 3 and 4. The Bragg mirror is reference 5, at the lower edge of the bottom electrode. The axis X, Y and Z of the crystal orientation of the piezoelectric layer, comprised between references 1 and 2, are also shown. The mesh dimensions are 1.7 m high and 2.5 m wide.

The harmonic admittance has been computed considering the mesh for two different boundary conditions. The first one consists of considering air on each side of the mesh, yielding a full reflection on the resonator edges. The second one consists in applying a boundary integral method to simulate the effect of the Bragg mirror on the backside of the bottom electrode. For both cases, no mechanical or dielectric loss was considered and the only source of leakage was acoustic radiation in the bulk in the case of the Bragg mirror configuration.

As can be seen in FIG. 6b, the presence of the Bragg mirror increase frequencies but reduces electromechanical coupling.

For the air backed device, a piezoelectric coupling of 5.8% was found whereas only 4.7% is calculated for the Bragg mirror case.

Figure 7A:
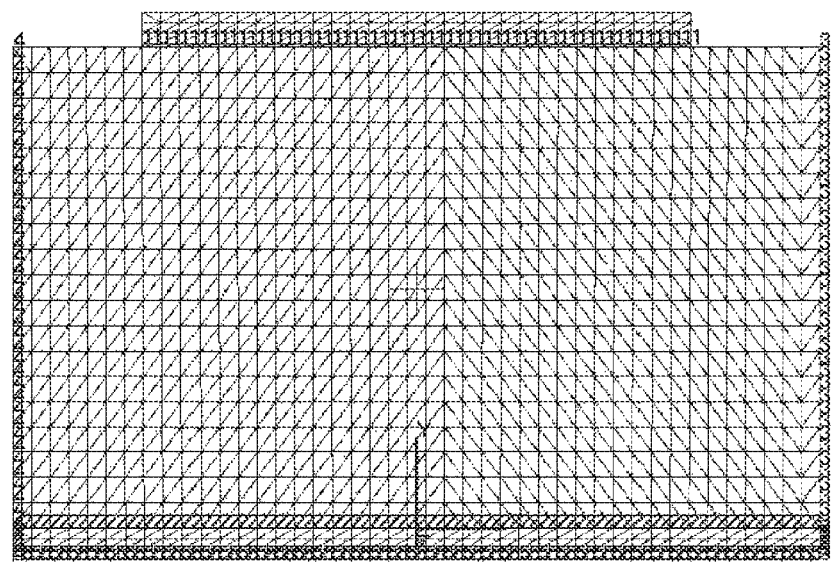
FIGS. 7a-7d show the characteristics of the excitation modes for a surface acoustic wave device for a particular example according to the second and fourth embodiment of the disclosure.

FIG. 7a shows the mesh used to simulate the basic structure consisting of an electrode grating deposited onto a composite substrate. The same reference number for the mesh are used as for the mesh of FIG. 6b. The mesh dimensions are again 1.7 μm high and 2.5 μm wide.

For this particular example, the composite substrate of the surface acoustic wave device comprises a C-axis oriented aluminum nitride layer of 1.5 μm thickness, and a bottom electrode of 100 nm thickness. The Bragg mirror 5 comprises an alternation of molybdenum and silica or fused quartz layers, each 500 nm thick, deposited onto a sapphire substrate. The substrate could also be silicon. The top electrode thickness is 100 nm.

The mesh shown in FIG. 7a represents a side view of the composite substrate for the surface acoustic device with only one top electrode finger 1 shown, with part of the piezoelectric layer on each side of the electrode finger being shown. This results in the piezoelectric layer shown as extending on both sides of the electrode finger 1. The excitation here still lays between the top (electrode finger) and bottom electrodes and is between a "surface" guided mode and the bulk acoustic mode (BAW) at second harmonic conditions.

Figure 7B:
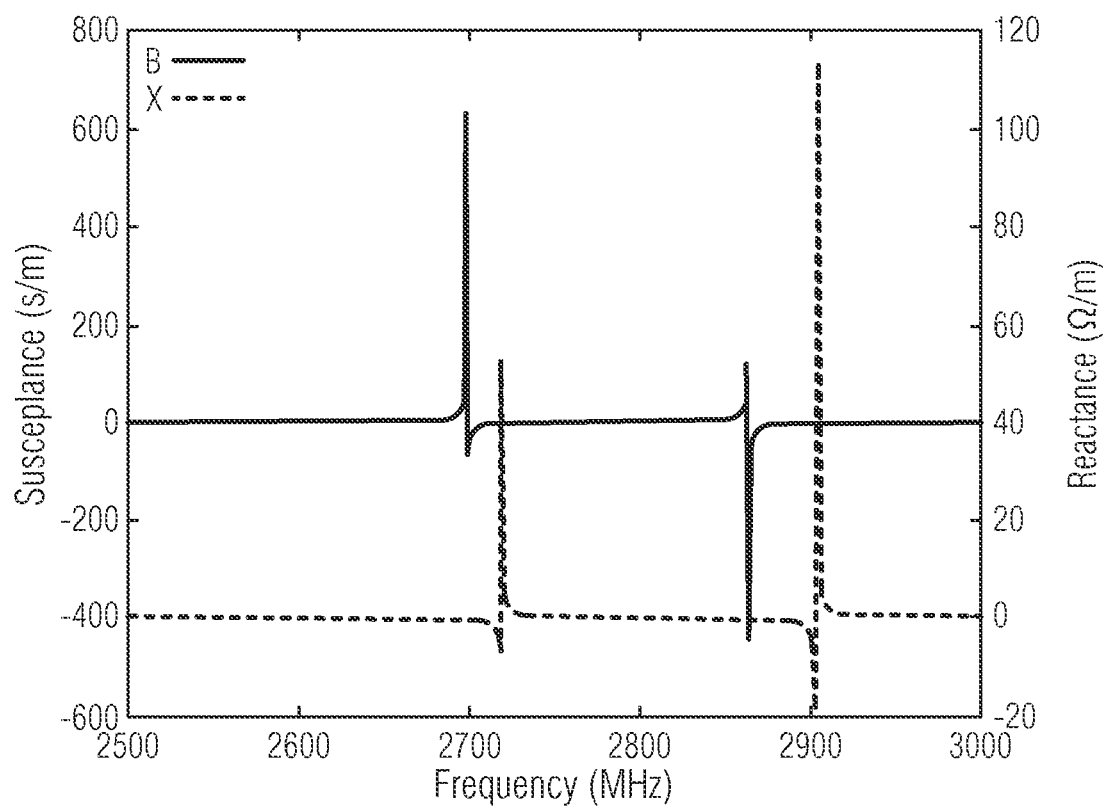

The harmonic admittance of the device shown in FIG. 7b shows a multiple mode signature, with modes near 2.7 GHz and near 2.87 GHz. The two principal modes are very close to one another but in phase opposition.

Figure 7C:
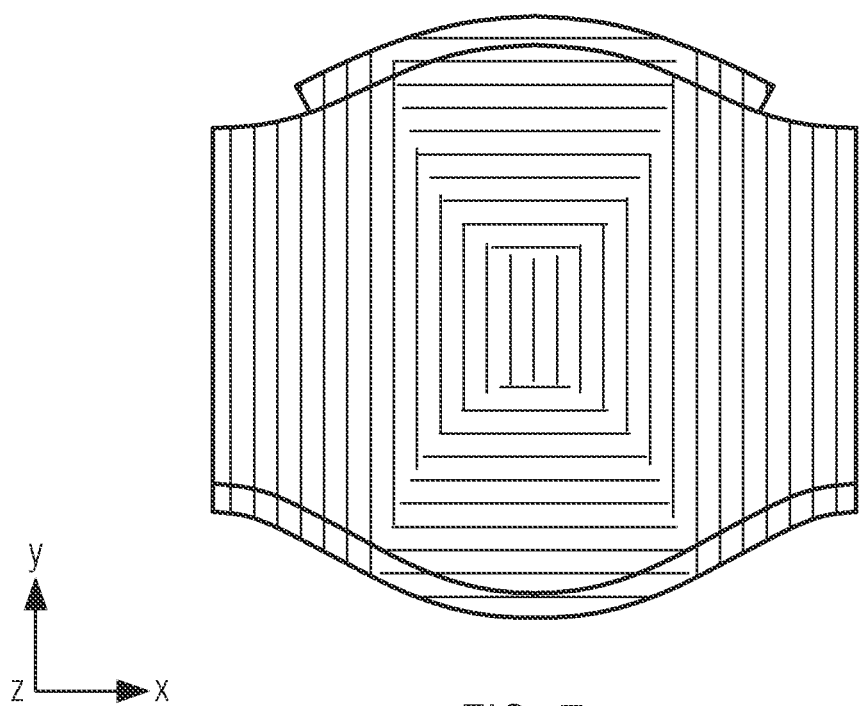
Figure 7D:
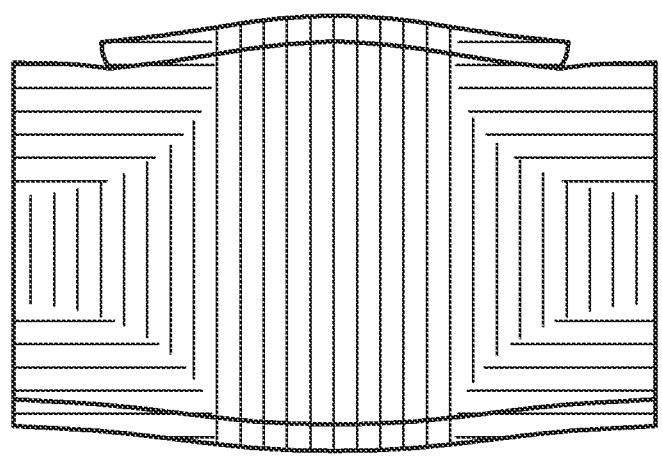

The shape of the modes near 2.7 GHz and near 2.87 GHz are shown in FIGS. 7c and 7d, respectively. They are comparable to elliptically polarized mode also known as Rayleigh waves propagating atop homogeneous half space crystal substrates. According to the boundary conditions, the mode shape corresponds to a standing wave regime.

Figure 8A:
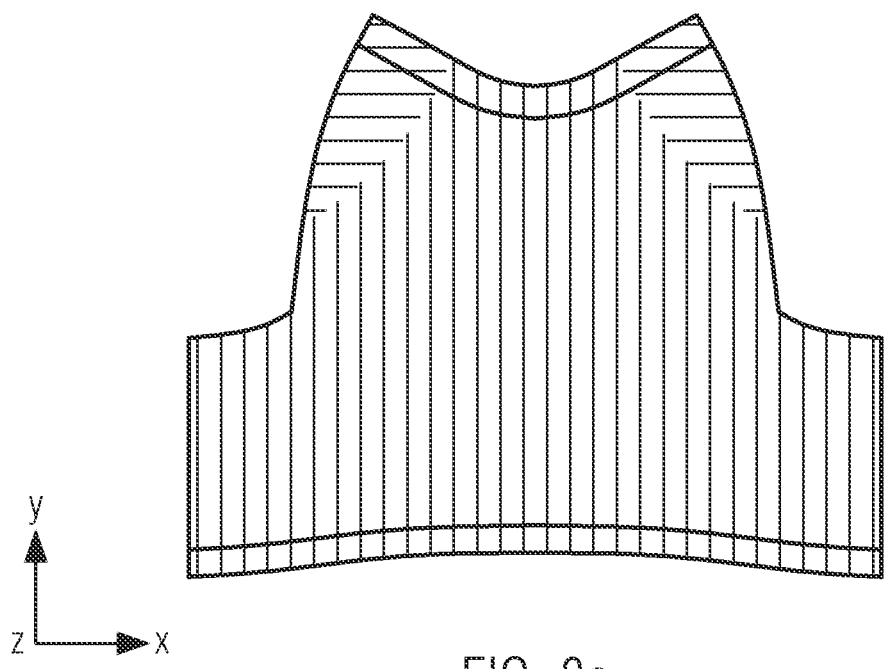
FIGS. 8a-8d show the characteristics of the excitation modes for a surface acoustic wave device for a particular example according to the second and fourth embodiment of the disclosure.
Figure 8B:
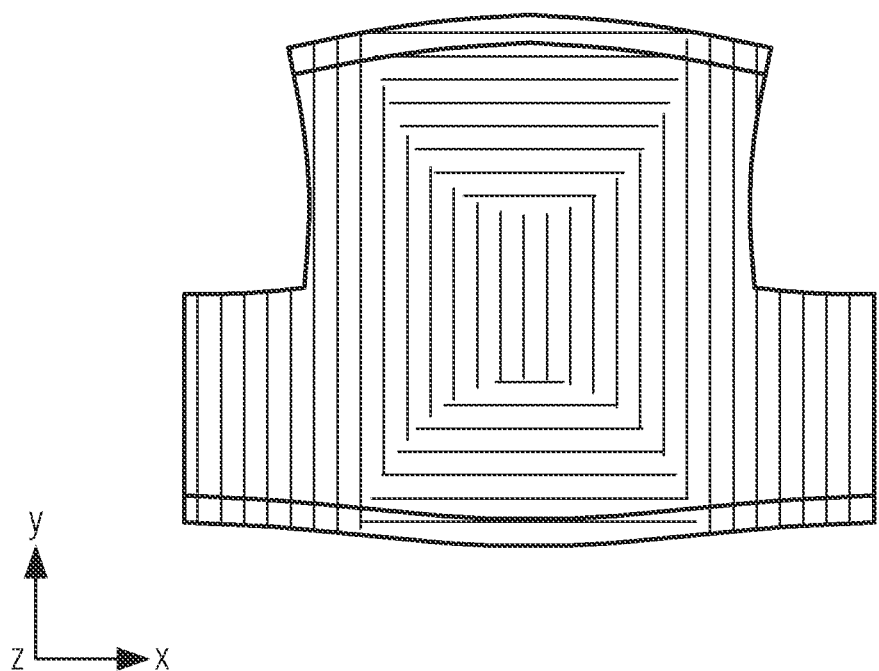
Figure 8C:
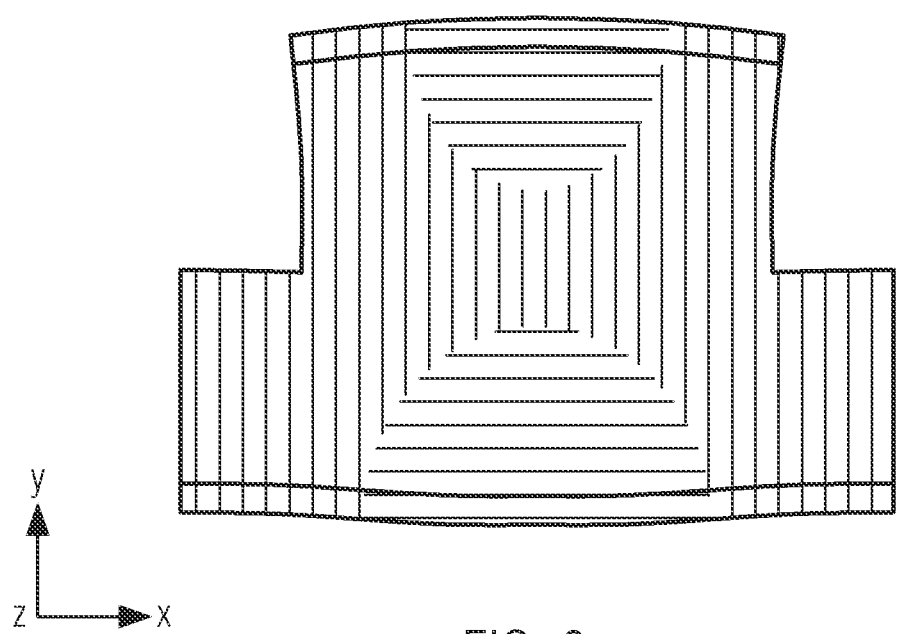
Figure 8D:
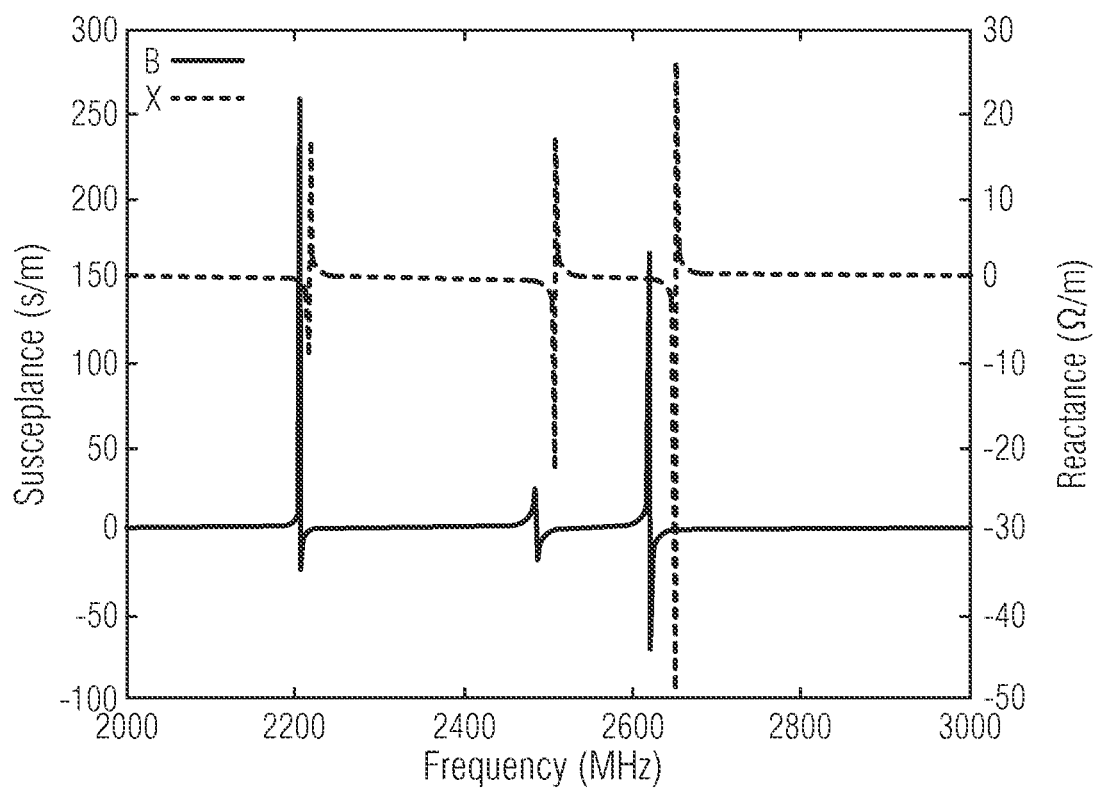

FIGS. 8a-8c show the mode deformation shape in the mesh structure, while FIG. 8d shows the harmonic admittance of the mode excitation operating on surface wave second harmonic mode, when part of the piezoelectric layer is removed between the electrode fingers for the particular case of FIGS. 7a-7d, according to the second embodiment of the disclosure. Again, only one electrode finger is shown.

As can be seen in the mesh of FIGS. 8a-8c, compared to the mesh of FIGS. 7a-7d, a partial etching of the piezoelectric layer between the electrode fingers has been performed so that the thickness of the piezoelectric layer between the electrode fingers is smaller than the thickness of the piezoelectric layer, being here 1.7 μm. The partial etching of the piezoelectric layer between the electrode fingers results in the shape of a step form in the piezoelectric layer in FIGS. 8a-8c, showing only a side view of one electrode finger, with on each side of the electrode finger, part of the regions where the partial etching of the piezoelectric layer is performed. Again the mesh dimensions are the same as for the mesh of FIGS. 7a-7d, namely 1.7 μm high and 2.5 μm wide.

As can be seen in FIG. 8d, an intermediate etching depth of the piezoelectric material in between the electrode fingers yields an increase of mode number, with three modes being present, near 2.2 GHz, near 2.48 GHz and near 2.62 GHz. Furthermore, none of the three modes achieves values of electromechanical coupling coefficient $k_s^2$ above the one of the BAW device. FIGS. 8a to 8c show the shape of those three modes, respectively.

FIGS. 9a-9d show the variation of mode excitation when varying the etching depth of the piezoelectric layer, between the electrode fingers, for the particular example of the composite substrate described in FIGS. 7a-7d, according to the second and third embodiment of the disclosure. The mesh dimensions of FIGS. 9a-9d are the same as for FIGS. 7a-7d.

Figure 9A:
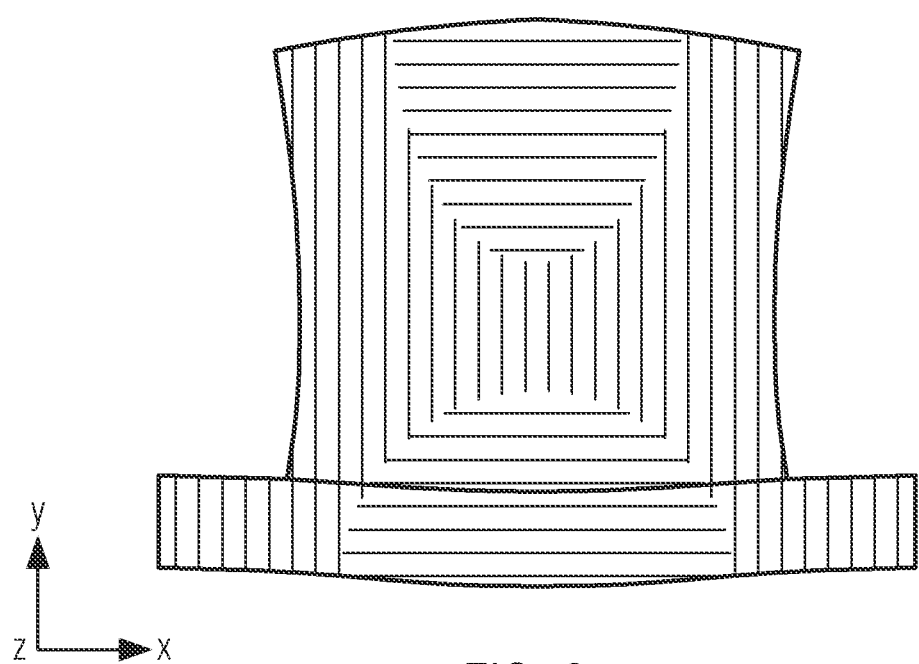
FIGS. 9a-9d show the characteristics of the excitation modes for a surface acoustic wave device for a particular example according to the second and fourth embodiment of the disclosure.
Figure 9B:
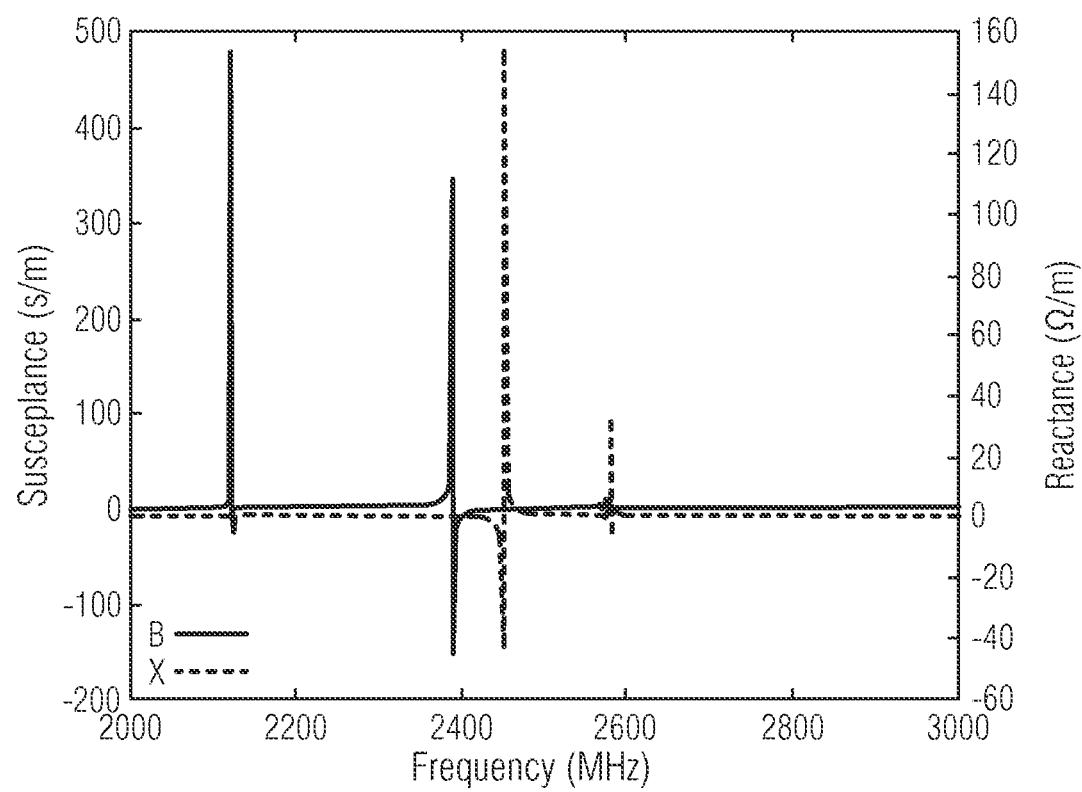
Figure 9C:
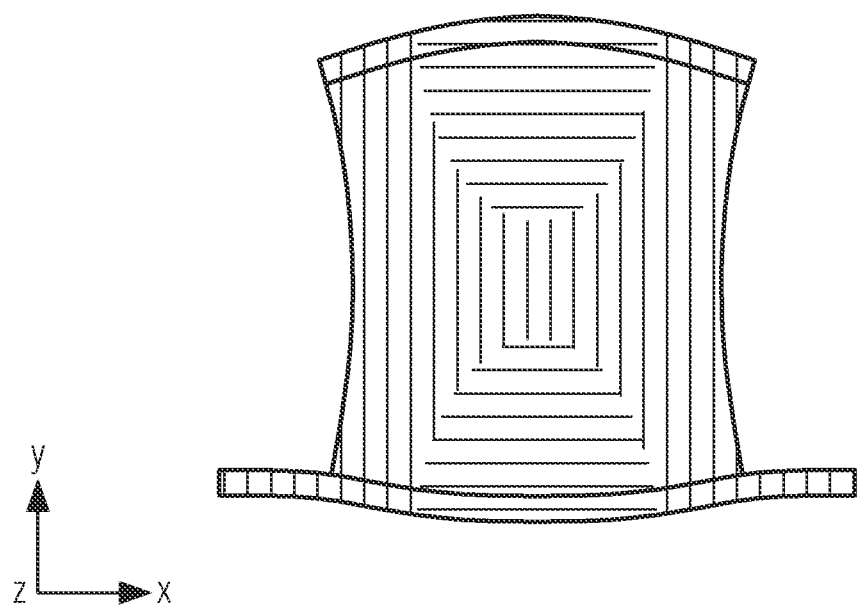

The etching depth of the piezoelectric is varied as can be seen starting from FIGS. 8a-8d, showing a small etching depth, therefore, a thicker AlN present between the electrode fingers and increasing the etching depth from FIG. 9a, with a thinner AlN between the electrodes as in FIGS. 8a-8d until reaching a complete etching of the AlN between the electrodes as shown in FIG. 9c.

Figure 9D:
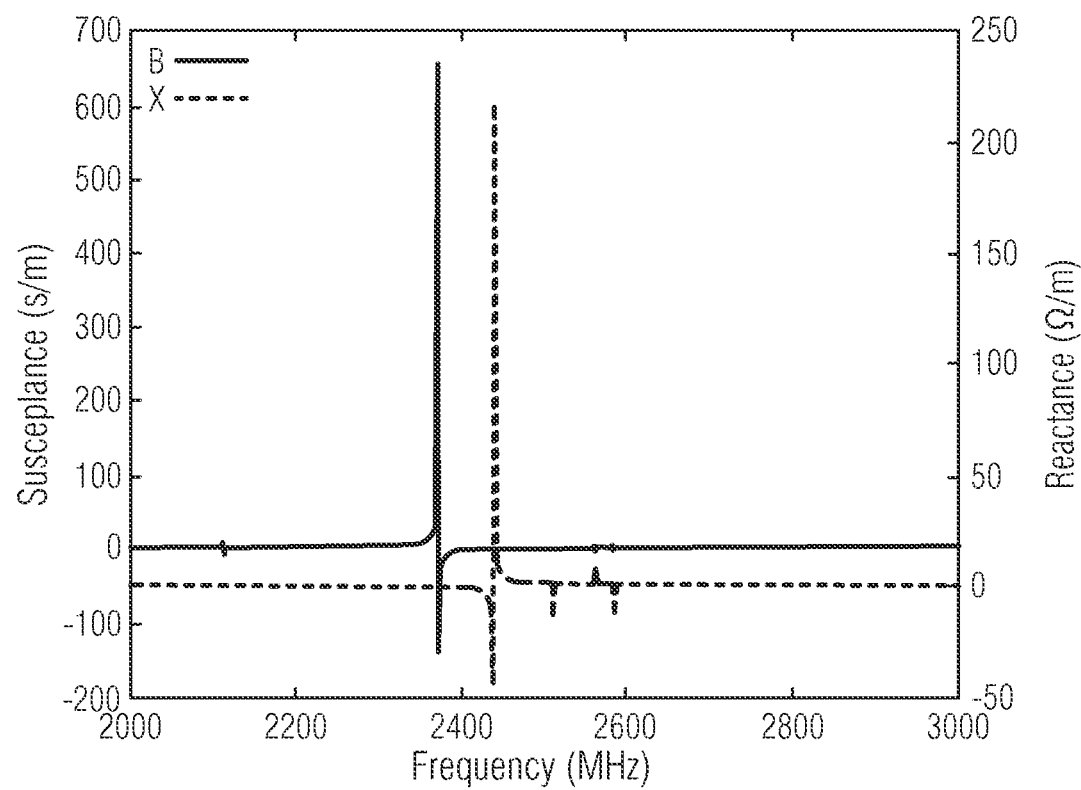

It can be seen that when the etching depth approaches the whole layer thickness of the piezoelectric material, the mode distribution is improved compared to the case shown in FIG. 8d. Indeed, a reduction of the number of modes to one principal mode near 2.4 GHz, with a few parasites, is achieved, as can be seen in FIGS. 9b and 9d.

Furthermore, the electromechanical coupling coefficient k varies with etching depth of the piezoelectric material in between the electrode fingers. Indeed, the electromechanical coupling coefficient $k_s^2$ of the principal mode near 2.4 GHz is clearly increased as can be seen in FIGS. 9b and 9d compared to the electromechanical coupling coefficient $k_s^2$ of the same mode near 2.4 GHz in FIG. 8d.

FIGS. 10a-10d show a schematic of the steps of the method for manufacturing a surface acoustic wave device according to any of the previous embodiments one, two or three of the disclosure.

The method comprises a step a) of providing an electrode layer 608 on top of a base substrate 606. The base substrate 606 is a silicon substrate, or any other substrate materials with high acoustic wave propagation velocity, such as diamond, sapphire, silicon carbide or even aluminum nitride. The electrode layer 608 can be made of any suitable conductive metal, for example, aluminum, or aluminum alloy or tungsten.

The next step b) comprises forming a piezoelectric layer 610 on the electrode layer 608, with a thickness t. The piezoelectric layer 610 by way of example may be either lithium niobate ($LiNbO_3$), or lithium tantalate ($LiTaO_3$). The thickness t of the piezoelectric layer 610 formed on the electrode layer 608 can be on the order of the wavelength, in particular, smaller than the wavelength. The piezoelectric layer 610 can also be a polycrystalline material or an epitaxy material, as well as zinc oxide (ZnO) or aluminum nitride (AlN) or aluminum scandium nitride (AlScN) or gallium nitride (GaN) and any composition of such nitride materials.

In a variant, a thin $SiO_2$ layer (not shown) can be provided on the electrode layer 608 prior to the forming of the piezoelectric layer 610. A layer of a molecular bonder can also be deposited on the base substrate 606 prior to the forming of the electrode layer 608 and/or on the electrode layer 608 prior to the forming of the piezoelectric layer 610 to improve the attachment.

Furthermore, further processing steps can be added, such as polishing of at least one of the base substrate 606 and the other layers.

According to step c) an upper comb electrode layer 612 is formed on the piezoelectric layer 610, using a combination of layer deposition and patterning steps. The upper comb electrode 612 comprises a plurality of electrode means 614. The upper comb electrode 612 and its respective electrode means 614 are formed of any suitable conductive metal, for example, aluminum, aluminum alloy, molybdenum or tungsten.

The method further comprises a step d) of modifying the piezoelectric layer 610. This step could be realized after step c) as illustrated but also before.

According to a first embodiment of the disclosure, the step d) of modifying the piezoelectric layer 610 comprises modifying at least one of the physical parameters of the piezoelectric layer 610 in certain regions 616 of the piezoelectric layer 610.

This step comprises an implantation or diffusion of atomic species 618, in particular, Ti, in order to modify the concentration of the atomic species in the piezoelectric layer 610 in the regions 616 of the piezoelectric layer 610 located between the electrode means 614.

According to a variant, the step d) of modifying the piezoelectric layer 610 can also comprise a proton exchange process 622 in order to modify the physical parameter being the refractive index of the piezoelectric layer 610 in the region 616 of the piezoelectric layer 610 situated in between the electrode means or fingers 614.

Proton exchange in lithium niobate involves a replacement of lithium ions (Li+) by hydrogen ions, or protons (H+). The replacement causes a change in refractive index, thus forming a waveguide. Proton exchange is one of the methods used for forming optical waveguides in lithium niobate, $LiNbO_3$, as well as in lithium tantalate, $LiTaO_3$.

The proton exchange process comprises a basic proton exchange from an organic proton source and an annealing post processing, which involves solely heating of the sample to redistribute the lithium and hydrogen ions.

By modifying the physical parameters of the piezoelectric layer 610 in the regions 616, it can also be that the thickness t of the piezoelectric layer 610 in the regions 616 can slightly be reduced due to the process employed.

According to a second embodiment of the method, the step d) of modifying the piezoelectric layer 610 comprises a step of reducing the thickness $t_r$ of the piezoelectric layer 610 in regions 616 between the electrode means 614. Thus, the thickness $t_r$ of the piezoelectric layer within the regions 616 is smaller than the thickness t of the piezoelectric layer 610 in the regions 624 situated below the electrode means 614, towards the base substrate 606.

This step comprises an etching step 626, in order to remove part of the piezoelectric layer 610 in the region 616 of the piezoelectric layer 610 located between the electrode means 614, or any other process that enables reduction of the thickness t of the piezoelectric layer 610 between the electrode means 614. The electrode means or fingers 614 can serve as a mask.

According to a third embodiment of the method, the step d) of modifying the piezoelectric layer 610 comprises a step of completely removing the piezoelectric layer 610 in the regions 616 of the piezoelectric layer 610, so that no piezoelectric layer 610 is present on top of the electrode layer 608. As in the previous variant, an etching step 626 is used, for example, a selective chemical etching step, in so-called wet or dry-plasma-enhanced etch conditions, or any process that enables removing the piezoelectric layer 610.

FIGS. 11a-11e show a schematic of the steps of the method for manufacturing a transducer structure for surface acoustic device of embodiment four and its variants according to the disclosure.

The method is based on the one as illustrated in FIGS. 10a-10d but, in addition, comprises a step of providing a Bragg mirror on or over the base substrate 606, before the step of forming the piezoelectric layer 610. Thus, the steps illustrated in FIGS. 11c to 11e correspond to the steps illustrated in FIGS. 10b to 10d.

Figure 11:
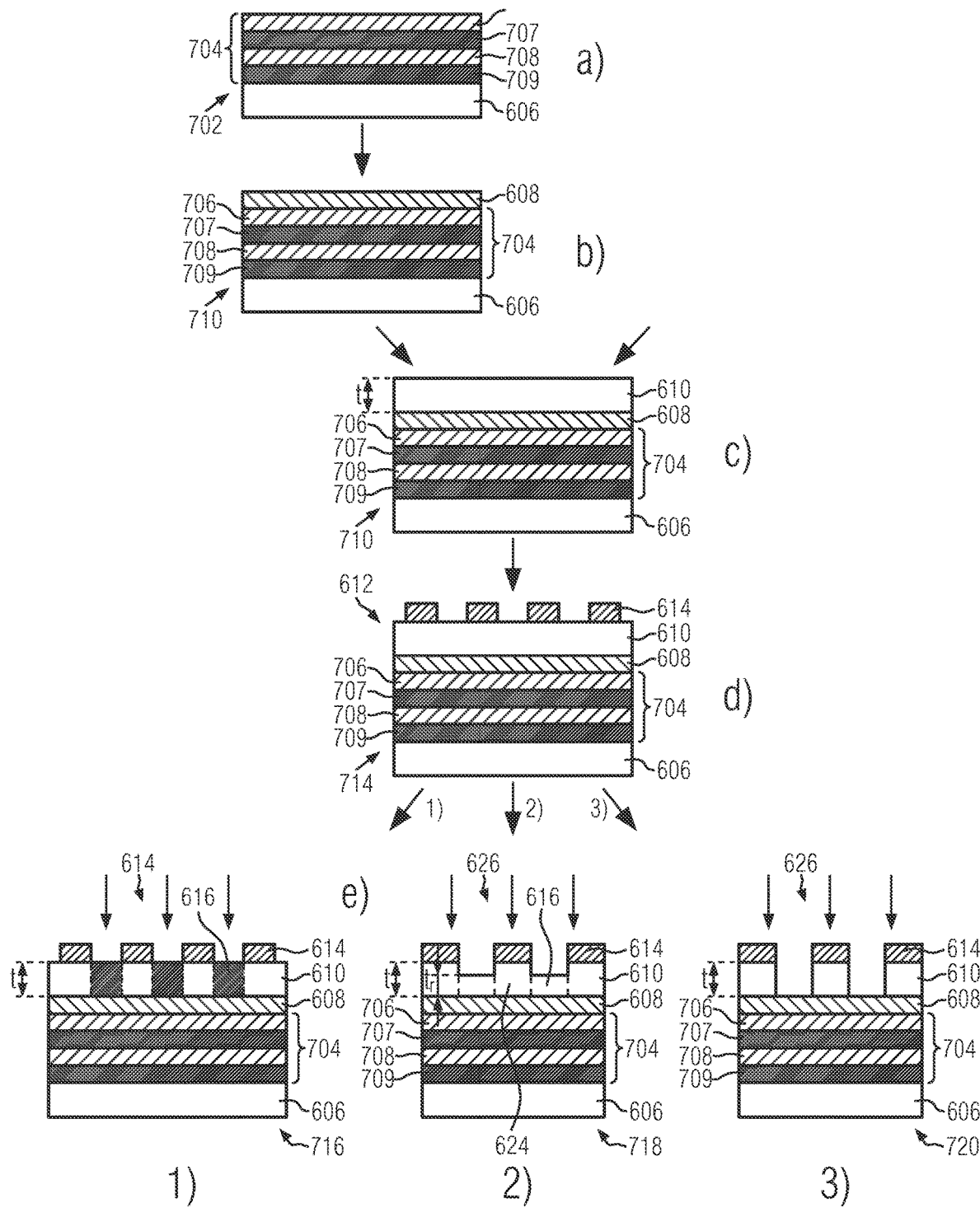
FIGS. 11a-11e show a schematic of the steps of the method for manufacturing a surface acoustic wave device according to any combination of the first to third embodiments with the fourth embodiment of the disclosure.

In FIG. 11a, a Bragg mirror 704 is provided on a base substrate 606. The Bragg mirror 704 is realized by the deposition of a stack of four layers 706 to 709 of alternating impedance.

In another variant, the acoustic mirror 704 can also have more or less than four layers of alternating high and low impedance forming the stack. The materials for the layers 706 to 709 can be tungsten, molybdenum, $LiTaO_3$, $Al_2O_3$, AlN, $LiNbO_3$, $Si_3N_4$, any combination of $SiO_2$ and $Si_3N_4$ (known as silicon oxy-nitride and noted $SiO_xN_y$, with x and y controlling the amount of each element in the compound), and ZnO, aluminum or $SiO_2$.

In a variant of the embodiment, at least one of the stacked layers 706 to 709 can also comprise a polymer material.

The method further comprises a step b) of providing an electrode layer 608 on top of the acoustic mirror 704, e.g., by layer deposition or layer transfer the electrode layer 608 can also be the last layer of the Bragg mirror 704.

In a variant of the embodiment, the step a) of fabricating the Bragg mirror 704 also comprises the step of forming the electrode layer 608, such that the electrode layer 608 forms part of the Bragg mirror 704. In particular, the electrode layer 608 is the top layer 706 of the Bragg mirror 704. In a variant, the electrode layer 608 can be another layer of the Bragg mirror 704 apart from the top layer 706, as long as it can be accessed for electrical connection.

In a variant of the embodiment, at least one of the steps of the method described above is a layer transfer process. For example, the step of layer transfer process comprises the transfer of a first substrate comprising the piezoelectric layer to a second substrate. The step of layer transfer process includes a step of direct bonding or a step of bonding via a dielectric layer, which will possibly be made of $SiO_2$, deposited on the first and/or second substrate(s). The step of layer transfer process can also include a step of implantation to delimit a detachment zone within the piezoelectric layer, so that the thickness of the piezoelectric layer transferred on the second substrate can be reduced compared to the thickness of the piezoelectric on the first substrate.

According to a variant, the second substrate comprises an electrode layer, so that the step of layer transfer process includes a step of bonding the piezoelectric layer to electrode layer by direct bonding or by direct bonding via a dielectric layer, which will possibly be made of $SiO_2$, deposited on the first and/or second substrates.

Figure 10:
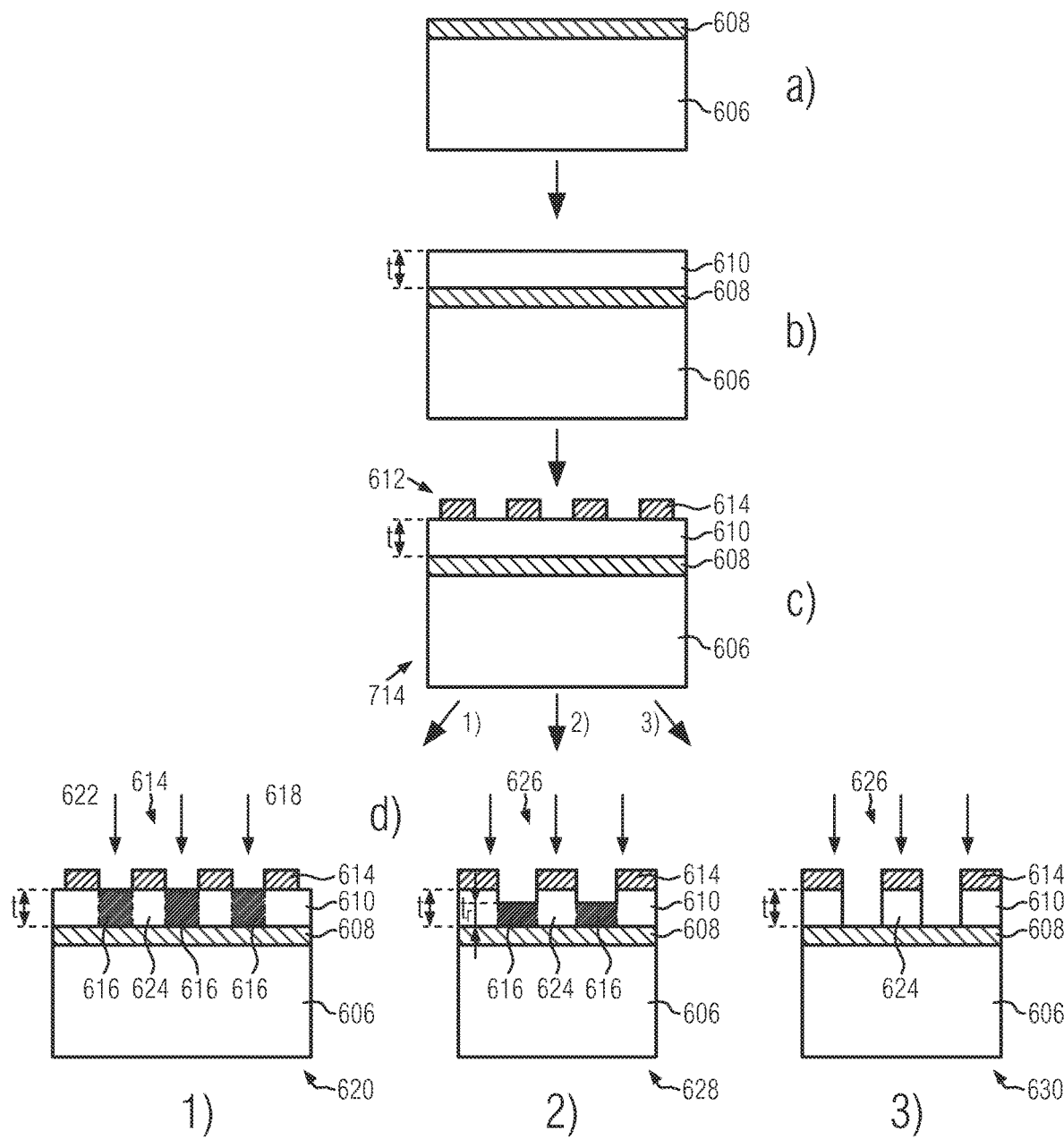
FIGS. 10a-10d show a schematic of the steps of the method for manufacturing a surface acoustic wave device according to any of the first, second and third embodiments of the disclosure.

Therefore, the final devices 716, 718 and 720 obtained with the method described previously actually correspond to the final devices 620, 628 and 630 of FIG. 10d, with only the difference that a Bragg mirror 704 is provided on or above the base substrate 606 and below the electrode layer 608.

A number of embodiments of the disclosure have been described. Nevertheless, it is understood that various modifications and enhancements may be made without departing the scope of the following claims.

What is claimed is:

1. A surface acoustic wave device, comprising:
a base substrate;
a piezoelectric layer;
an electrode layer in between the piezoelectric layer and the base substrate; and
a comb electrode formed on the piezoelectric layer comprising a plurality of electrode fingers with a pitch ρ, defined as ρ=λ, with λ being a wavelength of a standing acoustic wave generated by applying opposite potentials to the electrode layer and the comb electrode,
wherein, the piezoelectric layer comprises at least one region located in between the plurality of electrode fingers in which at least one physical parameter is different compared to the region underneath the plurality of electrode fingers; and
wherein either a) a thickness t of the piezoelectric layer is defined by optimization of a coupling between a bulk acoustic wave and the standing acoustic wave generated between the comb electrode and the electrode layer and is on the order or smaller than the wavelength λ of the standing acoustic wave or b) a dimension of the comb electrode is defined by optimization of the coupling between the bulk acoustic wave and the standing acoustic wave generated by the comb electrode.

2. The surface acoustic wave device of claim 1, wherein the at least one physical parameter of the piezoelectric layer being different in the at least one region is elasticity of the piezoelectric layer.

3. The surface acoustic wave device of claim 1, wherein the at least one physical parameter of the piezoelectric layer being different in the at least one region is a dopant concentration.

4. The surface acoustic wave device of claim 1, wherein a thickness $t_r$ in the at least one region of the piezoelectric layer is smaller than a thickness t of the piezoelectric layer.

5. The surface acoustic wave device of claim 4, wherein the piezoelectric layer is present only underneath the plurality of electrode fingers toward the base substrate.

6. The surface acoustic wave device of claim 1, further comprising a Bragg mirror underneath the piezoelectric layer.

7. The surface acoustic wave device of claim 6, wherein the electrode layer in between the piezoelectric layer and the base substrate is part of the Bragg mirror.

8. The surface acoustic wave device of claim 6, wherein the Bragg mirror comprises a plurality of layers of alternating impedance.

9. A frequency filter device comprising a surface acoustic wave device according to claim 1.

10. A method of fabrication of a surface acoustic wave device, comprising the steps of:
a) providing an electrode layer on top of a base substrate;
b) providing a piezoelectric layer on the electrode layer; and
c) forming an upper comb electrode layer including electrode fingers on the piezoelectric layer;
wherein, in step b), the piezoelectric layer is provided such that the piezoelectric layer comprises at least one region located in between the electrode fingers in which at least one physical parameter is different compared to the region underneath the electrode fingers and wherein step b) comprises a proton exchange in the at least one region of the piezoelectric layer located between the electrode fingers.

11. The method of claim 10, wherein step b) comprises an etching step for removing part or all of the piezoelectric layer in the region of the piezoelectric layer located between the electrode fingers.

12. The method of claim 10, wherein step b) comprises an implantation or diffusion of atomic species in the at least one region of the piezoelectric layer located between the electrode fingers.

13. The method of claim 10, further comprising a step d) of providing a Bragg mirror on or over the base substrate before the step of providing the piezoelectric layer.

14. The method of claim 13, further comprising forming the Bragg mirror such that the electrode layer is part of the Bragg mirror.

15. The method of claim 13, wherein at least one of the steps a) to d) comprises a layer transfer process.

* * * * *

UNITED STATES PATENT AND TRADEMARK OFFICE
CERTIFICATE OF CORRECTION

PATENT NO. : 12,255,612 B2
APPLICATION NO. : 18/583235
DATED : March 18, 2025
INVENTOR(S) : Sylvain Ballandras and Thierry LaRoche It is certified that error appears in the above-identified patent and that said Letters Patent is hereby corrected as shown below:

In the Specification

| | | |
|---|---|---|
| Column 1, | Line 47, | change "relation $\rho=n$, with" to --relation $\rho=\lambda/n$, with-- |
| Column 1, | Line 64, | change "comb p is equal" to --comb $\rho$ is equal-- |
| Column 3, | Line 6, | change "thickness t, in the" to --thickness $t_r$ in the-- |
| Column 7, | Line 24, | change "smaller than the wavelength of the transducer" to --smaller than the wavelength $\lambda$ of the transducer-- |
| Column 7, | Line 26, | change "The wavelength is the wavelength of" to --The wavelength $\lambda$ is the wavelength of-- |
| Column 7, | Line 40, | change "pitch p of the" to --pitch $\rho$ of the-- |
| Column 8, | Line 27, | change "216_1 and 2162 may form" to --216_1 and 216_2 may form-- |
| Column 9, | Line 37, | change "fingers 2121 and" to --fingers 212_1 and-- |
| Column 12, | Line 67, | change "are 1.7 m high" to --are 1.7 µm high-- |
| Column 12, | Line 67, | change "and 2.5 m wide." to --and 2.5 µm wide.-- |
| Column 14, | Line 31, | change "coefficient k varies" to --coefficient $k_s^2$ varies-- |

Signed and Sealed this
Twentieth Day of May, 2025

Coke Morgan Stewart
*Acting Director of the United States Patent and Trademark Office*